(12) United States Patent
Yan

(10) Patent No.: US 12,453,092 B2
(45) Date of Patent: Oct. 21, 2025

(54) SEMICONDUCTOR DEVICE AND FABRICATION METHOD THEREFOR

(71) Applicant: Yangtze Memory Technologies Co., Ltd., Hubei (CN)

(72) Inventor: Bingjie Yan, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 728 days.

(21) Appl. No.: 17/874,861

(22) Filed: Jul. 27, 2022

(65) Prior Publication Data

US 2023/0232626 A1 Jul. 20, 2023

Related U.S. Application Data

(63) Continuation of application No. PCT/CN2021/143066, filed on Dec. 30, 2021.

(51) Int. Cl.
| | |
|---|---|
| *H10B 43/27* | (2023.01) |
| *G11C 16/04* | (2006.01) |
| *H01L 23/522* | (2006.01) |
| *H01L 23/528* | (2006.01) |
| *H10B 41/27* | (2023.01) |
| *H10B 41/35* | (2023.01) |
| *H10B 43/35* | (2023.01) |

(52) U.S. Cl.
CPC ......... *H10B 43/27* (2023.02); *G11C 16/0483* (2013.01); *H01L 23/5226* (2013.01); *H01L 23/5283* (2013.01); *H10B 41/27* (2023.02); *H10B 41/35* (2023.02); *H10B 43/35* (2023.02)

(58) Field of Classification Search
CPC .............................. H10B 43/27; H01L 23/522
See application file for complete search history.

(56) References Cited

FOREIGN PATENT DOCUMENTS

| KR | 10-2021-0030969 A | 3/2021 |
|---|---|---|
| KR | 10-2021-0154834 A | 12/2021 |

(Continued)

OTHER PUBLICATIONS

Korean Office Action issued on Mar. 26, 2024 in the corresponding Korean Application No. 10-2022-7044925 (with English Summary), 8 pages.

(Continued)

*Primary Examiner* — Marvin Payen
(74) *Attorney, Agent, or Firm* — Oblon, McClelland, Maier &Neustadt, L.L.P.

(57) ABSTRACT

Aspects of the disclosure provide a memory system, a semiconductor device and fabrication method for the semiconductor device. The semiconductor device includes a memory stack with gate layers and insulating layers, and the gate layers and the insulating layers are stacked alternatingly. The semiconductor device also includes a first channel structure formed in a first channel hole in the memory stack. The first channel structure includes a channel plug in connection with a channel layer of the first channel structure. The semiconductor device also includes an isolation stack including a landing liner layer and an isolation layer. A first portion of the landing liner layer is laid on the channel plug. The semiconductor device includes a first contact structure formed in the isolation stack. The first contact structure is connected to the channel plug via an opening in the first portion of the landing liner layer.

20 Claims, 21 Drawing Sheets

(56) References Cited

FOREIGN PATENT DOCUMENTS

| | | |
|---|---|---|
| TW | 201947706 A | 12/2019 |
| TW | 202139429 A | 10/2021 |

OTHER PUBLICATIONS

Combined Taiwanese Office Action and Search Report issued on Oct. 6, 2023 in the corresponding Taiwanese Application No. 111150184 (with English Translation of Category of Cited Documents), 6 pages.

SEMICONDUCTOR DEVICE AND FABRICATION METHOD THEREFOR

CROSS-REFERENCE TO RELATED APPLICATIONS

This application is a continuation of International Application No. PCT/CN2021/143066, filed on Dec. 30, 2021, entitled "SEMICONDUCTOR DEVICE AND FABRICATION METHOD THEREFOR," which is hereby incorporated by reference in its entirety.

TECHNICAL FIELD

The present application describes embodiments generally related to a memory system, semiconductor devices and fabrication processes for the semiconductor devices.

BACKGROUND

Semiconductor manufactures developed vertical device technologies, such as three dimensional (3D) NAND flash memory technology, and the like to achieve higher transistor density without requiring smaller transistors. In some examples, a 3D NAND memory device includes an array of vertical memory cell strings. Each vertical memory cell string includes multiple memory cells that are connected in series. Increasing the number of memory cells in the vertical memory cell string can increase data storage density.

SUMMARY

Aspects of the disclosure provide a semiconductor device. The semiconductor device includes a memory stack with gate layers and insulating layers, and the gate layers and the insulating layers are stacked alternatingly. The semiconductor device also includes a first channel structure formed in a first channel hole in the memory stack. The first channel structure includes a channel plug in connection with a channel layer of the first channel structure. The semiconductor device also includes an isolation stack including a landing liner layer and an isolation layer. A first portion of the landing liner layer is laid on the channel plug. The semiconductor device includes a first contact structure formed in the isolation stack. The first contact structure is connected to the channel plug via an opening in the first portion of the landing liner layer.

In some embodiments, the landing liner layer is laid in a recess of the first channel structure from a top of the first channel hole. The first portion of the landing liner layer is laid at the bottom of the recess. In an example, the recess is aligned with the channel plug. In another example, the recess is wider than the channel plug.

In some embodiments, the first channel structure includes a blocking insulating layer, a charge storage layer, and a tunneling insulating layer between the channel layer of the first channel structure and a top gate layer in the memory stack.

In some other embodiments, the first channel structure includes an insulating layer between the channel layer of the first channel structure and a top gate layer in the memory stack. In some examples, the first channel structure includes a blocking insulating layer, a charge storage layer, and a tunneling insulating layer between the channel layer of the first channel structure and another gate layer in the memory stack.

In some examples, an etch selectivity of the isolation layer and the landing liner layer is over 10. In an example, the isolation layer is formed of silicon oxide, and the landing liner layer is formed of silicon nitride and/or nitrogen-doped carbon (NDC).

In some examples, a second portion of the landing liner layer being laid on a top insulating layer above a top gate layer in the memory stack. The semiconductor device includes a second contact structure formed in the isolation stack with a bottom landed in the second portion of the landing liner layer. The second contact structure is isolated from the top gate layer by the top insulating layer in the memory stack.

Aspects of the disclosure provide a method for fabricating a semiconductor device. The method includes forming a memory stack of gate layers and insulating layers. The gate layers and the insulating layers are stacked alternatingly. The method further includes forming a first channel structure in a first channel hole in the memory stack. The first channel structure includes a channel plug in connection with a channel layer of the first channel structure. The method also includes forming an isolation stack including a landing liner layer and an isolation layer. The first portion of the landing liner layer is laid on the channel plug. The method also includes forming a first contact structure in the isolation stack. The first connect structure is connected to the channel plug via an opening at the first portion of the landing liner layer.

To form the isolation stack, in some embodiments, the method includes recessing the channel plug from a top of the first channel hole to form a recess and laying the first portion of the landing liner layer at the bottom of the recess. In an example, the method includes removing a sidewall portion of the recess to enlarge the recess.

In an example, to recess the channel plug, the method includes recessing the channel plug surrounded by a tunneling insulating layer, a charge storage layer and a blocking insulating layer.

In another example, to recessing the channel plug, the method includes recessing the channel plug formed in a top select gate (TSG) stack of the memory stack.

In an embodiment, to forming the isolation stack, the method includes depositing a silicon nitride layer as the landing liner layer. In another embodiment, the method includes depositing a nitrogen-doped carbon (NDC) layer as the landing liner layer.

In some embodiments, to form the first contact structure, the method includes forming a first contact hole in the isolation layer. The first contact hole lands on the first portion of the landing liner layer. The method further includes forming an opening in the first portion of the landing liner layer based on the first contact hole. The opening exposes the channel plug. The method further includes forming the first contact structure in the first contact hole with the opening to the channel plug.

To form the first contact hole, in some examples, the method includes etching the isolation layer with an etch selectivity of the isolation layer to the landing liner layer being over 10.

Aspects of the disclosure provide a memory system device that includes a memory controller configured to control data storage operations of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
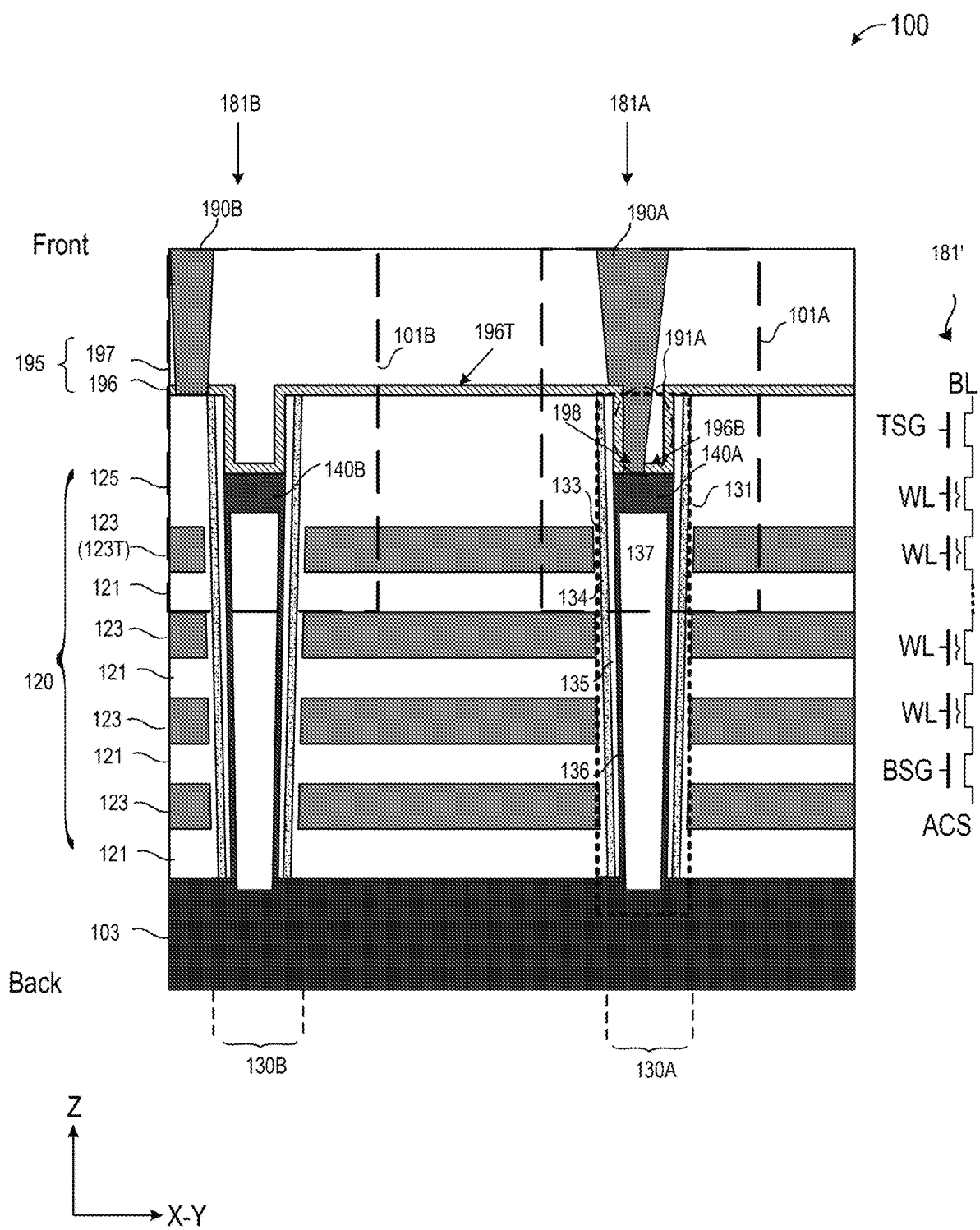
FIG. 1 shows a cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A vertical memory cell string in a three dimensional (3D) NAND flash memory generally includes memory cell transistors, one or more top select transistors and one or more bottom select transistors. The top select transistor(s) can couple or decouple the memory cells to a bit line based on control signal(s) applied on top select gate(s) (TSG) of the top select transistor(s). The bottom select transistor(s) can couple or decouple the memory cells to an array common source (ACS) terminal for an array of vertical memory cell strings based on control signal(s) applied on bottom select gate(s) (BSG) of the bottom select transistor(s).

Transistors in a vertical memory cell string, such as the memory cell transistors, top select transistors, and bottom select transistors, and the like are connected in series, and channels of the transistors can be formed as a channel layer extending vertically in a channel structure corresponding to the vertical memory cell string. The channel layer has two ends that respectively correspond to a source terminal of the vertical memory cell string and a drain terminal of the vertical memory cell string. The source terminal of the vertical memory cell string can be connected to an array common source and the drain terminal of the vertical memory cell string can be connected to a bit line. For ease of description, the end of the channel layer that is connected to the bit line is referred to as a drain terminal of the channel layer, and the end of the channel layer that is connected to the array common source is referred to as a source terminal of the channel layer.

Generally, the drain terminal of the channel layer is connected to the bit line by a contact structure that can be referred to as a channel contact structure. The drain terminal can be formed in a form of a channel plug in some examples. Channel contact structures can be formed based on an alignment of patterns for the channel contact structures with channel plugs of the channel structures during a lithography process. Due to stress, a wafer surface may be uneven. The unevenness can cause alignment offsets or misalignments during the lithography process. In some examples, the alignment offsets or misalignments by the patterns of the channel contact structures to the channel plugs may cause at least a portion of a channel contact structure landing on such as a top select gate layer, and thus may cause an electrical short (also referred to as a short circuit) between a bit line and the top select gate layer. In some examples, the top select gate layer is shared by vertical memory cell strings in an array to provide gate control signal to the top select transistors. The electrical short can cause failures of an array of vertical memory cell strings (e.g., vertical memory cell strings that share the top select gate layer), and reduce production yield.

Further, in some examples, channel structures are formed using multiple decks, such as a 3-deck architecture that includes a lower deck, a middle deck and a TSG deck. In the example of using a TSG deck, the portion of the channel structures in the TSG deck has a reduced critical dimension (CD) (e.g., diameter) compared to the portions of the channel structures in the lower deck and the middle deck in order to make space for TSG cut structures. The smaller CD can cause further difficulty in the alignment of the channel contact structures to the channel plugs.

Some aspects of the disclosure provide techniques for forming channel contact structures in the 3D NAND flash memory technology. In some examples, the techniques can be used to avoid short circuits between the channel contact structures and a top select gate layer, and thus reduce yield loss. In some examples, the techniques can be used to assist alignment of the channel contact structure to corresponding channel structure (e.g., channel plug of the channel structure).

Specifically, in some examples, a landing liner layer is used in an isolation stack for the channel contact structures. For example, the isolation stack includes the landing liner layer and a regular contact isolation layer (also referred to as isolation layer). The landing liner layer is formed of a material with a significant etch rate difference to the regular contact isolation layer. For example, an etch selectivity of the regular contact isolation layer to the landing liner layer is over 10, such as 20 in an example. The landing liner layer can protect an insulating layer on the top select gate layer from being etched through during an etching process for forming contact holes for the channel contact structures. Thus, the insulating layer on the top select gate layer can isolate the top select gate layer from a channel contact structure when the channel contact structure offsets to corresponding channel structure and lands in a region overlaps with the top select gate.

Further, in some examples, the landing liner layer can form a liner in a recess of a channel plug. The recess can be formed with self-alignment to the channel plug. The landing liner layer can be formed on the sidewall and bottom of the recess. The landing liner layer at the bottom of the recess can cover the drain terminal (e.g., the channel plug) of the channel layer. Even with alignment offsets, as long as a portion of the contact hole is landed on the bottom of the recess, an opening can be formed in the landing liner layer at the bottom of the recess based on the contact hole. Then, when the channel contact structure is formed in the contact hole, the channel contact structure can be connected to the drain terminal (e.g., channel plug) via the opening of the landing liner layer at the bottom of the recess. Other portions of the landing liner layer, such as on the portion on sidewall of the recess, can insulate the channel contact structure from other structures in the 3D NAND flash memory. Thus, the landing liner layer can assist a self-alignment of the channel contact structure to corresponding channel structure (e.g., channel plug).

FIG. 1 shows a cross-sectional view of a semiconductor device 100 according to some embodiments of the disclosure. The semiconductor device 100 includes an array of vertical memory cell strings 181 (e.g., shown as 181A and 181B) that are formed in a memory stack 120 of gate layers and insulating layers, and includes channel contact structures 190 (e.g., shown as 190A and 190B) formed in an isolation stack 195 of isolation layers. The channel contact structures 190 are formed of conductive materials, such as titanium (Ti), titanium nitride (TiN), tungsten and the like and are used to connect the vertical memory cell strings 181 to bit lines. The isolation stack 195 includes a landing liner layer 196 to avoid shorting circuits between channel contact structures 190 and a top gate layer (e.g., 123T) in the memory stack 120. Further, the landing liner layer 196 can assist self-alignment of the channel contact structures 190 to channel structures (e.g., channel plugs) according to some embodiments of the disclosure.

It is noted that the semiconductor device 100 can be any suitable device, for example, memory circuits, a semiconductor die with memory circuits formed on the semiconductor die, a semiconductor wafer with multiple semiconductor dies formed on the semiconductor wafer, a semiconductor chip with a stack of semiconductor dies bonded together, a semiconductor package that includes one or more semiconductor dies or chips assembled on a package substrate, and the like.

It is also noted that, besides the array of vertical memory cell strings 181, the semiconductor device 100 can include other circuitry (not shown), such as logic circuitry, power circuitry, periphery circuitry (e.g., address decoding circuit, page buffer circuit, data I/O circuit, a voltage generator, a controller and the like), and the like that is formed on a same die as the array of vertical memory cell strings 181, or a different die, and the other circuitry is suitably coupled with the array of vertical memory cell strings 181.

Generally, the semiconductor device 100 is fabricated based on a substrate, such as a silicon (Si) substrate, a germanium (Ge) substrate, a silicon-germanium (SiGe) substrate, and/or a silicon-on-insulator (SOI) substrate. In some examples, the substrate can be in the final product of the semiconductor device 100. In some other examples, the substrate can be removed during fabrication processing and thus the substrate is not in the final product of the semiconductor device 100. For simplicity, the main surface of the substrate is referred to as an X-Y plane, and the direction perpendicular to the main surface is referred to as Z direction.

The semiconductor device includes a semiconductor layer 103. In an example, the semiconductor layer 103 can be the silicon substrate. In another example, the semiconductor layer 103 can be an epitaxial layer formed on the substrate. In another example, the semiconductor layer 103 is a polysilicon layer formed from a back side of the semiconductor device 100 after an original substrate has been removed.

In the FIG. 1 example, the vertical memory cell strings 181 are three dimensional (3D) NAND memory cell strings 181, and the semiconductor layer 103 can form a source terminal for an array of vertical memory cell strings 181. The source terminal can be referred to as an array common source (ACS).

In some examples, the vertical memory cell strings 181 are formed in a core region. Besides the core region, the semiconductor device 100 includes a staircase region (not shown) to facilitate making connections to, for example, gates of the memory cells in the vertical memory cell strings, gates of the select transistors, and the like. The gates of the memory cells in the vertical memory cell strings 181 can correspond to word lines for the NAND memory architecture.

In the FIG. 1 example, two vertical memory cell strings 181A and 181B are shown as representation of an array of vertical memory cell strings formed in the core region. FIG. 1 also shows a schematic symbol version of a vertical memory cell string 181' corresponding to a vertical memory cell string 181. The vertical memory cell strings 181 are formed in the memory stack 120 of layers. The memory stack 120 includes gate layers 123 and insulating layers 121 that are stacked alternatingly, and channel structures 130 (shown as 130A and 130B) are formed in channel holes (shown by 131) in the memory stack 120. The memory stack 120 and the channel structures 130 are configured to form transistors that are stacked vertically. In some examples, a stack of transistors includes memory cells and select transistors, such as one or more bottom select transistors, one or more top select transistors and the like. In some examples, the stack of transistors can include one or more dummy select transistors. The gate layers 123 correspond to gates of the transistors. The gate layers 123 are made of gate stack materials, such as high dielectric constant (high-k) gate insulator layers, metal gate (MG) electrode, and the like. The insulating layers 121 are made of insulating material(s), such as silicon nitride, silicon dioxide, and the like.

According to some aspects of the disclosure, the channel portions of the vertical memory cell strings 181 are formed of the channel structures 130 that extend vertically (Z direction) into the memory stack of layers 120. The channel structures 130 can be disposed separate from each other in the X-Y plane. In some embodiments, the channel structures 130 are disposed in the form of arrays between gate line cut structures (not shown). The gate line cut structures can be used to facilitate replacement of sacrificial layers with the gate layers 123 in a gate-last process. The arrays of the channel structures 130 can have any suitable array shape, such as a matrix array shape along the X direction and the Y direction, a zig-zag array shape along the X or Y direction, a beehive (e.g., hexagonal) array shape, and the like. In some embodiments, each of the channel structures 130 has a circular shape in the X-Y plane, and a pillar shape in the X-Z plane and Y-Z plane. In some embodiments, the quantity and arrangement of the channel structures between gate line cut structures is not limited.

While the following description using the channel structure 130A as an example, other channel structures, such as the channel structure 130B, can be similarly configured as the channel structure 130A.

Using the channel structure 130A as an example, in some embodiments, the channel structure 130A has a pillar shape that extends in a Z direction that is perpendicular to the direction of a main surface X-Y plane. In an embodiment, the channel structure 130A is formed by materials in the circular shape (or elliptical shape or polygonal shape) in the X-Y plane, and extends in the Z direction. For example, the channel structure 130A includes function layers, such as a blocking insulating layer 133 (e.g., silicon oxide), a charge storage layer 134 (e.g., silicon nitride), a tunneling insulating layer 135 (e.g., silicon oxide), the channel layer 136, and an insulating layer 137 that have the circular shape (or elliptical shape or polygonal shape) in the X-Y plane, and extend in the Z direction. In an example, the blocking insulating layer 133 (e.g., silicon oxide) is formed on the sidewall of a channel hole 131 for the channel structure 130A, and then the charge storage layer 134 (e.g., silicon nitride), the tunneling insulating layer 135, the channel layer 136, and the insulating layer 137 are sequentially stacked from the sidewall. The channel layer 136 can be any suitable semiconductor material, such as polysilicon or monocrystalline silicon, and the semiconductor material may be un-doped or may include a p-type or n-type dopant. The channel layer 136 is also referred to as a semiconductor layer in some examples. In some examples, the semiconductor material is intrinsic silicon material that is un-doped. However due to defects, intrinsic silicon material can have a carrier density in the order of $10^{10}$ cm$^{-3}$ in some examples. The insulating layer 137 is formed of an insulating material, such as silicon oxide and/or silicon nitride, and/or may be formed as an air gap.

According to some aspects of the disclosure, the channel structures 130 and the memory stack of layers 120 together form the memory cell strings 181.

Using the channel structure 130A as an example, the channel layer 136 corresponds to the channel portions for transistors in the vertical memory cell string 181A, and the gate layers 123 corresponds to the gates of the transistors in the memory cells string 181A. Generally, a transistor has a gate that controls a channel, and has a drain and a source at each side of the channel. For simplicity, in the FIG. 1 example, the upper side of the channel for transistors in FIG. 1 is referred to as the drain, and the bottom side of the channel for transistors in FIG. 1 is referred to as the source. It is noted that the drain and the source can be switched under certain driving configurations. In the FIG. 1 example, the channel layer 136 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the vertical memory cell string 181A are connected in series. In an example, the drain of the top most transistor in the vertical memory cell string 181A is referred to as the drain terminal of the vertical memory cell string 181A, and the source of the bottom most transistor in the vertical memory cell string 181 is referred to as the source terminal of the vertical memory cell string 181A.

The vertical memory cell string 181A includes memory cell transistors (or referred to as memory cells). A memory cell transistor can have different threshold voltages based on carrier trappings in a portion of the charge storage layer 134 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programmed state (also referred to as erased state) corresponding to logic "1". When holes are expelled from the floating gate, the threshold voltage of the memory cell transistor is above a predefined value, thus the memory cell transistor is in a programed state corresponding to logic "0" in some examples.

The vertical memory cell string 181A includes one or more top select transistors configured to couple/de-couple the memory cells in the vertical memory cell string 181A to a bit line, and includes one or more bottom select transistors configured to couple/de-couple the memory cells in the vertical memory cell string 181 to the array common source (ACS), such as the semiconductor layer 103 in an example.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled to the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled to the ACS.

In the FIG. 1 example, in the channel structure 130A, the channel layer 136 extends vertically from the source side of the channel structure 130 up, and is conductively connected with a channel plug 140A. The channel plug 140A is configured as the drain terminal of the vertical memory cell string 181A. In some examples, the channel plug 140A is formed of a semiconductor material, such as doped (p-type doped or n-type doped) polysilicon, and the like. For example, the channel plug 140A is formed as a polysilicon plug and is in conductive connection with the channel layer 136.

In the FIG. 1 example, the semiconductor device 100 includes connection portions 101 (shown as 101A and 101B) that show configurations for connection drain terminals of the vertical memory cell strings 181 to bit lines. Each connection portion 101 includes a channel contact structure 190 (shown by 190A and 190B) and a corresponding channel plug (shown by 140A and 140B) in a channel structure. Some channel contact structures are conductively connected with the corresponding channel plugs, such as shown by the connection portion 101A; some channel contact structures are failed to be conductively connected with the corresponding channel plugs, such as shown by the connection portion 101B.

According to an aspect of the disclosure, the channel contact structures 190 are formed in an isolation stack 195 above the memory stack 120. In the FIG. 1 example, a top most gate layer (shown by 123T) in the memory stack 120 is referred to as a top gate layer 123T. The memory stack 120 includes an insulating layer 125 (e.g., silicon dioxide) on the top gate layer 123T. In some examples, the top gate layer 123T is configured to provide a gate control signal for a top select transistor in the vertical memory cell string 181. The top gate layer 123T can be shared by multiple vertical memory cell strings in an array in some examples.

The isolation stack 195 can be formed over the insulating layer 125. The isolation stack 195 is used to provide insulation between channel contact structures, and provide insulation to the channel structures from metal wire routings (not shown, e.g., above the isolation stack 195). The isolation stack 195 includes a landing liner layer 196 and an isolation layer 197. The isolation layer 197 can be formed of regular insulating material, such as silicon dioxide formed by various deposition processes. The landing liner layer 196 is formed of an insulating material of a significant etch rate difference to the isolation layer 197.

For example, an etch process to form contact holes (e.g., contact holes for the channel contact structures 190) is referred to as contact hole etch process. In some examples, the contact hole etch process can use a reactive ion etching (RIE) etch process. Parameters of the RIE etch process can be suitable adjusted, such that the etch rate of the isolation layer 197 to the etch rate of the landing liner layer 196 is over 10, such as about 20 in an example. The ratio of the thickness of the insulating material 197 and the thickness of the landing liner layer 196 can be suitably determined, such that the contact hole etch process can stop on the landing liner layer 196, and the landing liner layer 196 can prevent the contact hole etch process from etching layers underneath the landing liner layer 196, such as the insulating layer 125, and the like. In an example, the landing liner layer 196 is formed of silicon nitride (SiN). In another example, the landing liner layer 196 is formed of nitrogen-doped carbon (NDC).

In FIG. 1, the connection portion 101A includes a channel contact structure 190A and the channel plug 140A. The channel contact structure 190A and the channel plug 140A are conductively connected with success. The channel contact structure 190A can connect the drain terminal of the vertical memory cell string 181A to a bit line (BL).

Specifically, in some examples, the channel plug 140A is recessed from the top of the channel hole 131 before a deposition of the landing liner layer 196. For example, originally, the channel plug 140 is extended to the top of the channel hole 131, and then a portion of the channel plug 140A has been removed from the top of the channel hole 131. The recessed space of the channel plug 140A from the top of the channel hole 131 is referred to as a recess 191A.

When the landing liner layer 196 is deposited, the landing liner layer 196 is laid in the recess 191A, for example on the sidewalls of the recess 191A and on the bottom of the recess 191A. A portion of the landing liner layer 196 at the bottom of the recess 191A is shown by 196B, and a portion of the landing liner layer on the insulating layer 125 is shown by 196T. The channel contact structure 190A is formed in the isolation stack 195A, and at least a portion of the channel contact structure 190A is landed in the recess 191A and is connected to the channel plug 140A via an opening 198 of the portion 196B of the landing liner layer. The opening 198 of the landing liner layer 196B can be formed using an etching process based on physical argon ion bombardment, and the etching process is referred to as a punch process in some examples.

It is noted that the landing liner layer 196 is in touch with the channel plug 140A at the bottom of the recess 191A, the opening 198 of the landing liner layer 196B at the bottom of the recess 191A can expose the channel plug 140A, thus when the channel contact structure 190A is formed, the channel contact structure 190A can be connected with the channel plug 140A via the opening 198 of the landing liner layer 196B.

According to an aspect of the disclosure, the recess 191A is formed by a polysilicon plug recess process, such as a polysilicon wet etch process, and the recess 191A is self-aligned with the channel plug 140A. When the landing liner layer 196 is deposited, the portion 196B of the landing liner layer 196 in the recess 191A is self-aligned with channel plug 140A. During the contact hole etch process, for example, as long as a portion of the contact hole is landed on the bottom portion 196B of the landing liner layer 196 in the recess 191A, the punch process can form the opening 198, and expose the channel plug 140A. When the channel contact structure 190A is formed in the contact hole, the channel contact structure 190A can be conductively connected with the channel plug 140A via the opening 198 of the landing liner layer 196. The recess 191A and the portion 196B of the landing liner layer 196 can assist self-alignment of the channel contact structure 190A to the channel plug 140A.

According to an aspect of the disclosure, due to uneven surface (e.g., stress related), a channel contact structure may be failed to be aligned with the corresponding channel plug, and the channel contact structure is failed to be conductively connected with the corresponding channel plug, such as shown by the connection portion 101B.

Specifically, the connection portion 101B includes the channel contact structure 190B and a channel plug 140B of the channel structure 130B. The channel contact structure 190B and the channel plug 140B are failed to be conductively connected. The channel contact structure 190B is offset to the corresponding channel structure 130B, for example, due to stress related uneven surface, and thus the channel contact structure 190B fails to be connected with the channel plug 140B of the channel structure 130B.

The channel structure 130B is similarly configured as the channel structure 130A. The channel plug 140B is similarly configured as the channel plug 140A. The description of the channel structures and the channel plugs has been provided above and will be omitted here for clarity purposes.

In some examples, due to uneven surface, a contact hole pattern for the channel contact structure 190B is misaligned with the channel structure 130B during a lithography process. Then, during the contact hole etch process to form a contact hole according to the contact hole pattern, the landing liner layer 196, such as the portion 196T of the landing liner layer 196 can prevent etching into the insulating layer 125. When the contact structure 190B is formed in the contact hole that misaligns with the channel structure 130B, the insulating layer 125 can isolate the channel contact structure 190B and the top gate layer 123T, and avoid the short circuit between the channel contact structure 190B to the top gate layer 123T.

The channel contact structure 190B fails to be connected with the channel plug 140B of the channel structure 130B, and thus memory cells of the vertical memory cell string 181B will fail for data storage operations.

According to an aspect of the disclosure, the misalignment of the channel contact structure 190B and the channel structure 130B may cause a failure of the vertical memory cell string 181B, but does not affect operations of other vertical memory cell strings, such as the vertical memory cell string 181A, that share the top gate layer 123T with the vertical memory cell string 181B (e.g., the other vertical memory cell strings have no misalignment issue).

In some examples, the semiconductor device 100, such as 3D NAND flash memory die, may have a small number, such as less than 0.1% vertical memory cell strings, that may fail due to misalignment of the channel contact structures to the corresponding channel structures (e.g., channel plugs). The semiconductor device 100 can be designed to have enough redundant vertical memory cell strings that can replace the less than 0.1% failed vertical memory cell strings. Thus, the semiconductor device 100 can be counted as a good die, and the misalignment of the channel contact structures to the corresponding channel structures does not cause production yield loss.

In a related 3D NAND flash memory die example, a misalignment of a channel contact structure to a channel structure not only causes a failure of a vertical memory cell string corresponding to the channel structure, but also cause a large number of vertical memory cell strings that share the top gate layer to fail due to a short circuit between the channel contact structure and the top gate layer. The number of vertical memory cell strings that share the top gate layer can be large, such as over 1K. When redundant vertical memory cell strings on the related 3D NAND flash memory die are not enough to replace the large number of failed vertical memory cell strings, the related 3D NAND flash memory die is counted as a failed die, and the misalignment of the channel contact structure to the channel structure causes yield loss.

Figure 2:
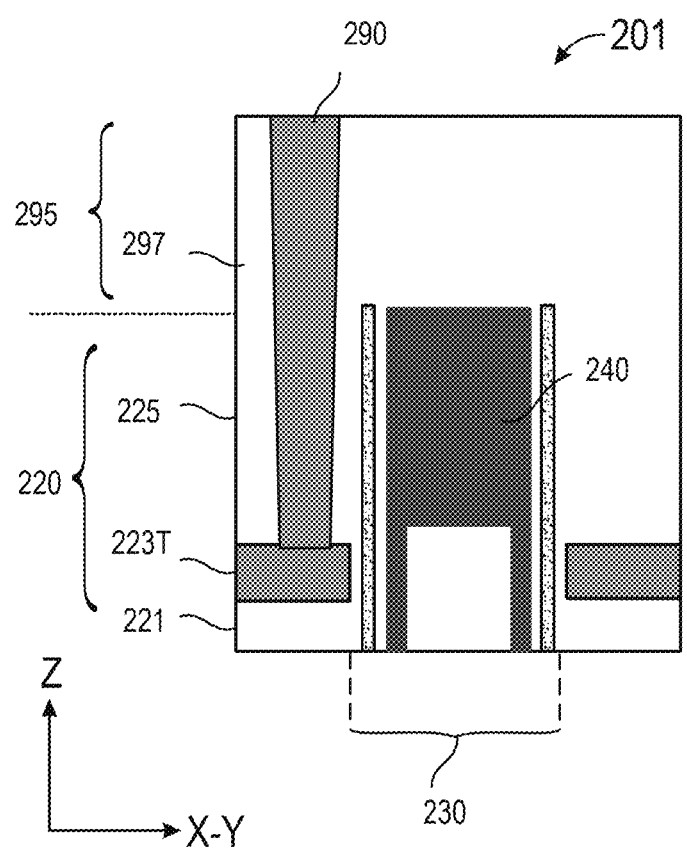
FIG. 2 shows a cross sectional view of a connection portion in a related example.

FIG. 2 shows a cross sectional view of a connection portion 201 of a related 3D NAND flash memory die in a related example. The connection portion 201 includes a channel contact structure 290 and a channel plug 240 of a corresponding channel structure 230. The channel contact structure 290 and the channel plug 240 are failed to be conductively connected. In the FIG. 2 example, the channel contact structure 290 is misaligned with the channel structure 230. The channel structure 230 is formed in a memory stack 220 of layers. The memory stack 220 includes gate layers 223 and insulating layers 221 stacked alternatingly, and includes an insulating layer 225 that covers a top gate layer 223 (shown by 223T). The channel contact structure 290 is formed in an isolation stack 295. The isolation stack 295 includes an isolation layer 297, and does not include an etch stop layer similar to the landing liner layer 196. Without an etch stop layer, the misalignment of the channel contact structure 290 to the channel structure 230 can cause vertical memory cell strings that share the top gate layer 223T to fail.

For example, due to uneven surface, a contact hole pattern for the channel contact structure 290 is misaligned with the channel structure 230. During the contact hole etch process to form the contact hole according to the contact hole pattern, without an etch stop layer, the contact hole can be etched through the isolation layer 297 and the insulating layer 225. In some examples, same material is used for the isolation layer 297 and the insulating layer 225. The contact hole etch process may stop on the top gate layer 223T in some examples. When the contact structure 290 is formed in the contact hole that misaligns with the channel structure 230, the contact structure 290 is shorted to the top gate layer 223T. The top gate layer 223T is shared by a large number of vertical memory cell strings in an array. Thus, the misalignment of the channel contact structure 290 to the channel structure 230 can cause failure of the vertical memory cell strings in the array, and can cause yield loss.

Figure 3:
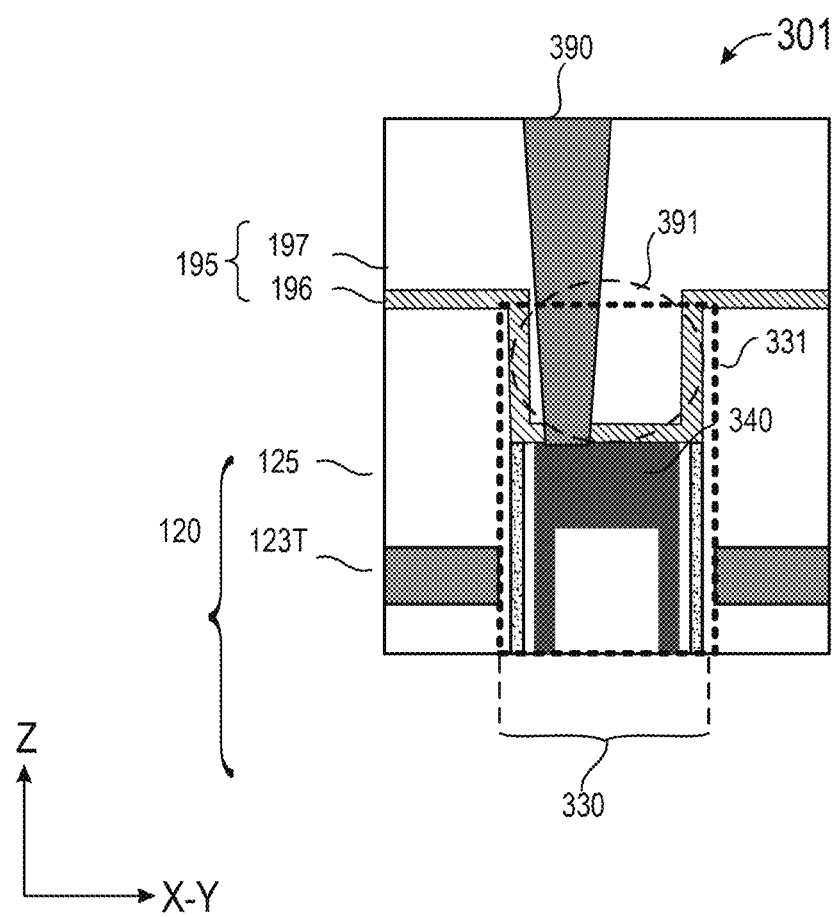
FIG. 3 shows a cross sectional view of a connection portion in a semiconductor device according to some embodiments of the disclosure.
Figure 4:
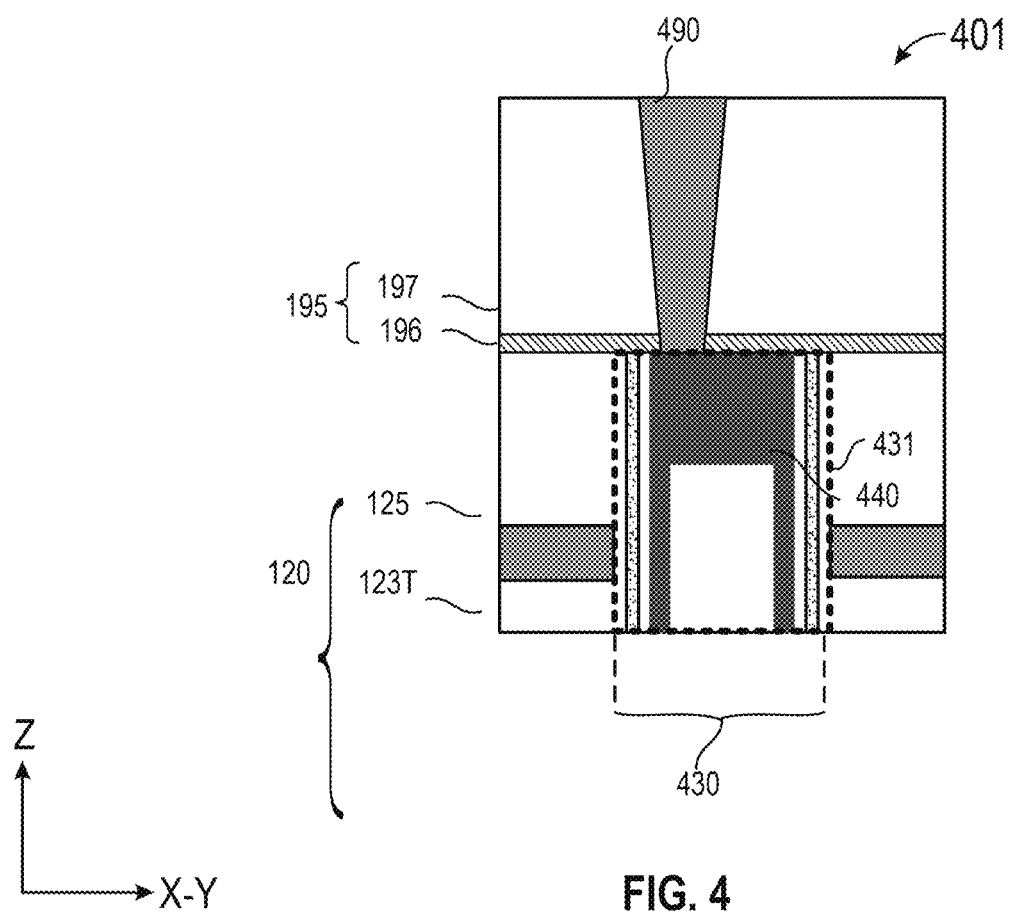
FIG. 4 shows a cross sectional view of another connection portion in a semiconductor device according to some embodiments of the disclosure.

It is noted that the connection portion 101A shown in FIG. 1 can be suitably modified, such as shown in FIG. 3 and FIG. 4.

FIG. 3 shows a cross sectional view of a connection portion 301 according to some embodiments of the disclosure. The connection portion 301 has a wider recess 391 compared to the recess 191A in FIG. 1. In some examples, the connections portions, such as the connection portions 101A, in the semiconductor device 100 can be configured according to the connection portion 301.

In some examples, after the recess process of the channel plug 340 (e.g., an etch of the channel plug 340 from the top of the channel hole 331), a wet etch process can be used to remove some insulating materials on the sidewall of the recess in order to enlarge the recess 391. The wider recess 391 can ease the landing of the channel contact structure 390 to the channel plug 340.

In the FIG. 3 example, the landing liner layer 196 can protect the insulating layer 125 on the top gate layer 123T from being etched during an etching process for forming contact hole for the channel contact structure 390 when the channel hole pattern is misaligned to the channel structure 330. Thus, the insulating layer 125 can isolate the top gate layer 123T from the channel contact structure 390 when the channel contact structure 390 misaligns to the corresponding channel structure 330.

FIG. 4 shows a cross sectional view of a connection portion 401 according to some embodiments of the disclosure. The connection portion 401 does not recess the channel plug 440 from the top of the channel hole 431. In some examples, the connections portions, such as the connections portion 101A, in the semiconductor device 100 can be configured according to the connection portion 401.

In the FIG. 4 example, the landing liner layer 196 can protect the insulating layer 125 on the top gate layer 123T from being etched during an etching process for forming contact hole for the channel contact structure 490 when the channel hole pattern is misaligned to the channel structure 430. Thus, the insulating layer 125 can isolate the top gate layer 123T from the channel contact structure 490 when the channel contact structure 490 misaligns to the corresponding channel structure 430.

According to some aspects of the disclosure, channel structures can be formed using multiple deck technology. In some examples, a channel structure can include a lower portion formed in a lower deck, a middle portion formed in a middle deck, and an upper portion formed in an upper deck. In an example, the upper portion of the channel structure only includes top select transistor(s), and the upper deck is referred to as a TSG deck. The upper portion of the channel structure can be formed of a different structure from the lower portion and/or the middle portion. The above used techniques, such as using a landing liner layer for avoiding short circuits, using a channel plug recess for self-alignment, and the like can be similarly used on the TSG deck, and the upper portion of the channel structure.

Figure 5:
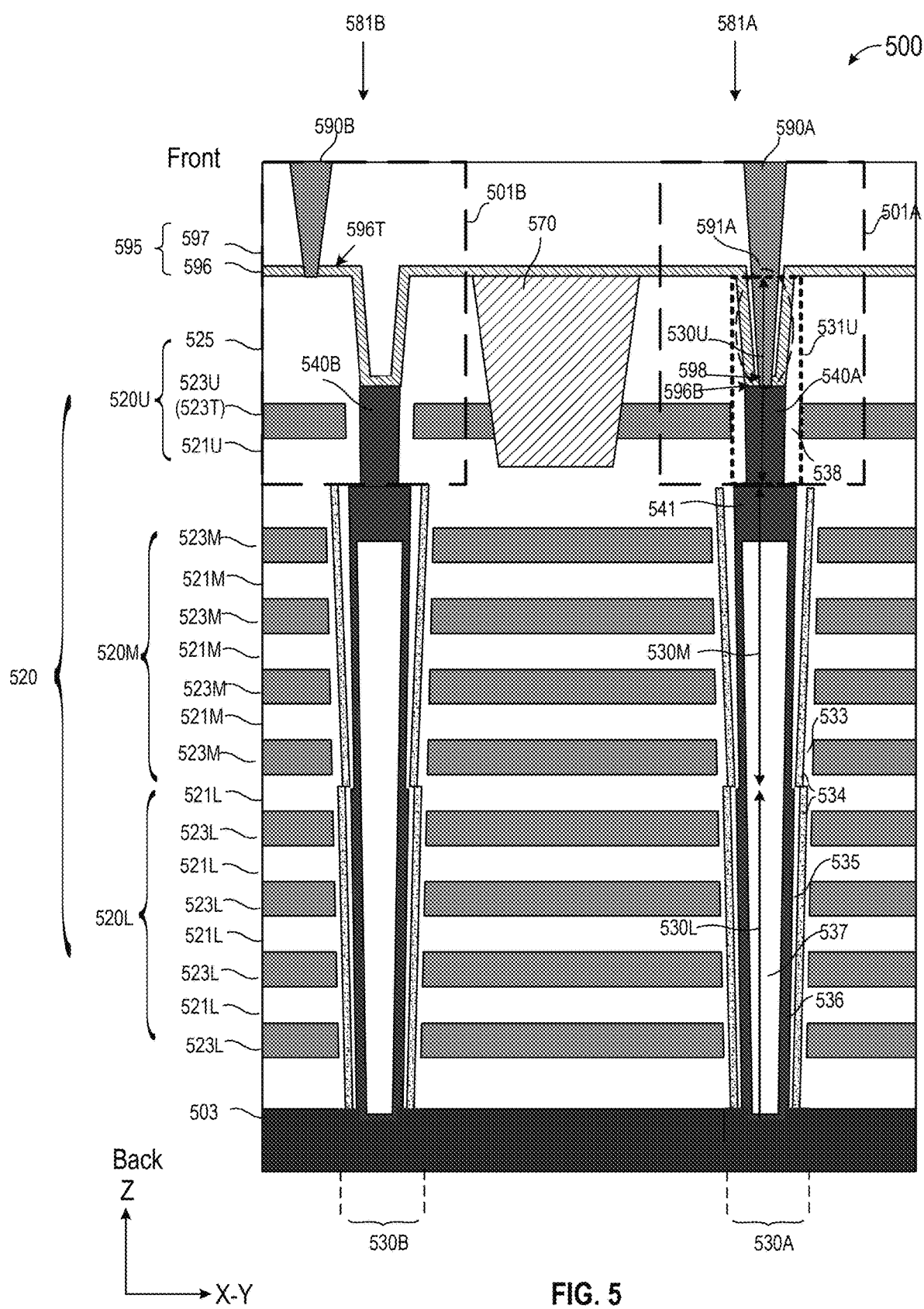
FIG. 5 shows a cross-sectional view of a semiconductor device according to some embodiments of the disclosure.

FIG. 5 shows a cross-sectional view of a semiconductor device 500 according to some embodiments of the disclosure. The semiconductor device 500 includes an array of vertical memory cell strings 581 (e.g., shown as 581A and 581B) that are formed in a memory stack 520 of gate layers and insulating layers, and includes channel contact structures 590 (e.g., shown as 590A and 590B) formed in an isolation stack 595 of isolation layers. The channel contact structures 590 are formed of conductive materials, such as titanium (Ti), titanium nitride (TiN), tungsten and the like and are used to connect the vertical memory cell strings 581 to bit lines. The isolation stack 595 includes a landing liner layer 596 to avoid shorting circuits between channel contact structures 590 and a top gate layer in the memory stack 520. Further, the landing liner layer 596 can assist self-alignment of the channel contact structures 590 to channel structures according to some embodiments of the disclosure.

It is noted that the semiconductor device 500 can be any suitable device, for example, memory circuits, a semiconductor die with memory circuits formed on the semiconductor die, a semiconductor wafer with multiple semiconductor dies formed on the semiconductor wafer, a semiconductor chip with a stack of semiconductor dies bonded together, a semiconductor package that includes one or more semiconductor dies or chips assembled on a package substrate, and the like.

It is also noted that, besides the array of vertical memory cell strings 581, the semiconductor device 500 can include other suitable circuitry (not shown), such as logic circuitry, power circuitry, periphery circuitry, and the like that is formed on a same die as the array of vertical memory cell strings 581, or a different die, and is suitably coupled with the array of vertical memory cell strings 581.

Generally, the semiconductor device 500 is fabricated based on a substrate, such as a silicon (Si) substrate, a germanium (Ge) substrate, a silicon-germanium (SiGe) substrate, and/or a silicon-on-insulator (SOI) substrate. In some examples, the substrate can be in the final product of the semiconductor device 500. In some other examples, the substrate can be removed during fabrication processing and thus the substrate is not in the final product of the semiconductor device 500. For simplicity, the main surface of the substrate is referred to as an X-Y plane, and the direction perpendicular to the main surface is referred to as Z direction.

The semiconductor device includes a semiconductor layer 503. In an example, the semiconductor layer 503 can be the silicon substrate. In another example, the semiconductor layer 503 can be an epitaxial layer formed on the substrate. In another example, the semiconductor layer 503 is a polysilicon layer formed from a back side of the semiconductor device 500 after an original substrate has been removed.

In the FIG. 5 example, the vertical memory cell strings 581 are three dimensional (3D) NAND memory cell strings 581, and the semiconductor layer 503 can form a source terminal for the 3D NAND memory cell strings. The source terminal can be referred to as an array common source (ACS).

In some examples, the vertical memory cell strings 581 are formed in a core region. Besides the core region, the semiconductor device 500 includes a staircase region (not shown) to facilitate making connections to, for example, gates of the memory cells in the vertical memory cell strings, gates of the select transistors, and the like. The gates of the memory cells in the vertical memory cell strings 581 can correspond to word lines for the NAND memory architecture.

In the FIG. 5 example, two vertical memory cell strings 581A and 581B are shown as representation of an array of vertical memory cell strings 581 formed in the core region. It is noted that the schematic symbol version of a vertical memory cell string 181' can also be used to correspond to a vertical memory cell string 581. The vertical memory cell strings 581 are formed using a multi-deck architecture, such as 3-deck in FIG. 5.

The vertical memory cell strings 581 are formed by channel structures 530 (shown by 530A and 530B) in a memory stack 520. The memory stack 520 includes gate layers and insulating layers that are stacked alternatingly. The memory stack 520 includes a lower stack 520L of gate layers and insulating layers, a middle stack 520M of gate layers and insulating layers and an upper stack 520U of gate layers and insulating layers. A channel structure 530, such as the channel structure 530A, includes a lower portion 530L formed in the lower stack 520L of gate layers and insulating layers, a middle portion 530M formed in the middle stack 520M of gate layers and insulating layers, and an upper portion 530U formed in the upper stack 520U of gate layers and insulating layers.

While the following description uses the channel structure 530A as an example, other channel structures, such as the channel structure 530B, can be similarly configured as the channel structure 530A.

In some embodiments, the lower stack 520L of gate layers and insulating layers includes gate layers 523L and insulating layers 521L that are stacked alternatingly. The gate layers 523L and the insulating layers 521L are configured to form first transistors that are stacked vertically. In some examples, the first transistors formed in the lower stack 520L includes memory cells and one or more bottom select transistors. In some examples, the first transistors can include one or more dummy select transistors. The gate layers 523L correspond to gates of the first transistors. The gate layers 523L are made of gate stack materials, such as high dielectric constant (high-k) gate insulator layers, metal gate (MG) electrode, and the like. The insulating layers 521L are made of insulating material(s), such as silicon nitride, silicon dioxide, and the like. In some examples, the gate layers 523L are of a same thickness within process variations, such as about 300 Å, and the insulating layers 521L are of a same thickness within process variations, such as about 200 Å.

Further, the lower portion 530L of the channel structure 330 is formed in the lower stack 520L of gate layers and insulating layers and extends vertically (Z direction) into the lower stack 520L. In some embodiments, the lower portion 530L has a pillar shape that extends in the Z direction that is perpendicular to the direction of the main surface of the substrate (not shown). In an embodiment, the lower portion 530L of the channel structure 530A is formed by materials in the circular shape in the X-Y plane, and extends in the Z direction.

Similarly, in some embodiments, the middle stack 520M of gate layers and insulating layers includes gate layers 523M and insulating layers 521M that are stacked alternatingly. The gate layers 523M and the insulating layers 521M are configured to form second transistors that are stacked vertically. In some examples, the second transistors formed in the middle stack 520M include memory cells. In some examples, the second transistors can include memory cells and one or more top select transistors or dummy select transistors. The gate layers 523M correspond to gates of the second transistors. The gate layers 523M are made of gate stack materials, such as high dielectric constant (high-k) gate insulator layers, metal gate (MG) electrode, and the like. The insulating layers 521M are made of insulating material(s), such as silicon nitride, silicon dioxide, and the like. In some examples, the gate layers 523M are of a same thickness within process variations, such as about 300 Å, and the insulating layers 521M are of a same thickness within process variations, such as about 200 Å.

Further, the middle portion 530M of the channel structure 530 is formed in the middle stack 520M of gate layers and insulating layers and extends vertically (Z direction) in the middle stack 520M. In some embodiments, the middle portion 530M has a pillar shape that extends in the Z direction that is perpendicular to the direction of the main surface of for example wafer substrate. In an embodiment, the middle portion 530M of the channel structure 530A is formed by materials in the circular shape in the X-Y plane, and extends in the Z direction.

According to some examples, the lower portion 530L and the middle portion 530M of the channel structure 530A includes function layers, such as a blocking insulating layer 533 (e.g., silicon dioxide), a charge storage layer (e.g., silicon nitride) 534, a tunneling insulating layer 535 (e.g., silicon dioxide), a channel layer 536, and an insulating layer 537 that have the circular shape in the X-Y plane, and extend in the Z direction.

In some examples, to form the lower portion 530L and the middle portion 530M of the channel structure 530A, an initial lower stack of sacrificial layers and insulating layers corresponding to the lower stack 520L of gate layers and insulating layers (the sacrificial layers will be replaced with gate layers in a later process) is formed. Then, an opening for the lower portion 530L of the channel structure 530A can be formed into the initial lower stack, and the opening is referred to as a lower channel hole for the lower portion 530L.

In some examples, the lower channel hole for the lower portion 530L is initially filled with a sacrificial channel structure, such as sacrificial polysilicon. Then, an initial middle stack of sacrificial layers and insulating layers corresponding to the middle stack 520M of gate layers and insulating layers (the sacrificial layers will be replaced with gate layers in a later process) is formed. After an opening (middle channel hole) for the middle portion 530M of the channel structure 530A is formed in the initial middle stack, the sacrificial channel structure in the lower channel hole is exposed and can be removed from the lower channel hole, thus the lower channel hole is combined with the middle channel hole into a combined channel hole. In an example, the blocking insulating layer 533 (e.g., silicon dioxide) is formed on the sidewall of the combined channel hole, and then the charge storage layer (e.g., silicon nitride) 534, the tunneling insulating layer 535, the channel layer 536, and the insulating layer 537 are sequentially stacked from the sidewall of the combined channel hole. The channel layer 536 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 537 is formed of an insulating material, such as silicon dioxide and/or silicon nitride, and/or may be formed as an air gap.

In the FIG. 5 example, an intermediate channel plug 541 is formed at the top of the middle portion 530M of the channel structure 530A. To form the intermediate channel plug 541, in an example, a top portion of the insulating layer 537 is removed to form a recess, and then semiconductor material for the intermediate channel plug 541 can be deposited to fill the recess, and then excess semiconductor material can be removed, for example by chemical mechanical polishing process.

In some embodiments, the upper stack 520U of gate layers and insulating layers includes gate layers 523U and insulating layers 521U that are stacked alternatingly. The gate layers 523U and the insulating layers 521U are configured to form third transistors that are stacked vertically. In some examples, the third transistors formed in the upper stack 520U include one or more top select transistors. The gate layers 523U correspond to gates of the third transistors. In some examples, the gate layers 523U are made of gate stack materials, such as high dielectric constant (high-k) gate insulator layers, metal gate (MG) electrode, and the like. In some examples, the gate layers 523U are made of polysilicon. The insulating layers 521U are made of insulating material(s), such as silicon nitride, silicon dioxide, and the like. The upper stack 520U is also referred to as TSG stack 520U.

In the TSG stack 520U, a topmost gate layer 523 is shown by 523T, and the TSG stack 520U includes an insulating layer 525 on the gate layer 523T.

In some examples, the upper portion 530U of the channel structure 530A has different structure from the middle portion 530M and/or the lower portion 530L of the channel structure 530. In some embodiments, the upper portion 530U of channel structure 530 has a pillar shape that extends in a Z direction that is perpendicular to the direction of a main surface X-Y plane. In an embodiment, the upper portion 530U is formed by materials in the circular shape (or elliptical shape or polygonal shape) in the X-Y plane, and extends in the Z direction. For example, the upper portion 530U of the channel structure 530 includes function layers, such as an insulating layer 538 (e.g., silicon oxide) and the channel plug 540A, that have the circular shape (or elliptical shape or polygonal shape) in the X-Y plane, and extend in the Z direction. In an example, the insulating layer 538 (e.g., silicon oxide) is formed on the sidewall of an upper channel hole 531U for the upper portion 530U, and then the channel plug 540A can be formed. The channel plug 540A can be formed of any suitable semiconductor material, such as polysilicon or monocrystalline silicon, and the semiconductor material may be un-doped or may include a p-type or n-type dopant.

In some examples, the channel plug 540A is formed of a semiconductor material, such as doped (p-type doped or n-type doped) polysilicon, and the like. The channel plug 540A is formed on the intermediate channel plug 541.

According to an aspect of the disclosure, the semiconductor device 500 includes TSG cut structures 570 that are used to divide top select gate layer(s), such as the gate layer 523T into separate portions, and thus divide an array of vertical memory cell strings 581 into sub-arrays. Then, separate control signals can be provided to the separate portions of the gate layer 523T to perform sub-array based operations. In order to make space for the TSG cut structures 570, in some examples, the critical dimension size (e.g., diameter) of the upper portion 530U is reduced compared to the middle portion 530M and the lower portion 530L.

In the FIG. 5 example, the semiconductor device 500 includes connection portions 501 (shown as 501A and 501B) that show configuration for connecting drain terminals of the vertical memory cell strings 581 to bit lines. Each connection portion 501 includes a channel contact structure 590 (shown by 590A and 590B) and a corresponding channel plug (shown by 540A and 540B) in a channel structure. Some channel contact structures are conductively connected with the corresponding channel plugs, such as shown by the connection portion 501A; some channel contact structures are failed to be conductively connected with the corresponding channel plugs, such as shown by the connection portion 501B.

According to an aspect of the disclosure, the channel contact structures 590 are formed in an isolation stack 595 above the memory stack 520. In the FIG. 5 example, the memory stack 520 includes the insulating layer 525 (e.g., silicon dioxide) on the top gate layer 523T. In some examples, the top gate layer 523T is configured to provide a gate control signal for a top select transistor in the vertical memory cell strings 581. The top gate layer 523T can be shared by multiple vertical memory cell strings in a sub-array in some examples.

The isolation stack 595 can be formed over the insulating layer 525. The isolation stack 595 is used to provide insulation between channel contact structures, and provide insulation to the channel structures from metal wire routings (not shown, e.g., above the isolation stack 595). The isolation stack 595 includes a landing liner layer 596 and an isolation layer 597. The isolation layer 597 can be formed of regular insulating material, such as silicon dioxide formed by various deposition processes. The landing liner layer 596 is formed of an insulating material of a significant etch rate difference to the isolation layer 597.

For example, an etch process to form contact holes (e.g., contact holes for the channel contact structures 590) is referred to as contact hole etch process. In some examples, the contact hole etch process can use a reactive ion etching (RIE) etch process. Parameters of the RIE etch process can be suitable adjusted, such that the etch rate of the isolation layer 597 to the etch rate of the landing liner layer 596 is over 10, such as about 20 in an example. The ratio of the thickness of the insulating material 597 and the thickness of the landing liner layer 596 can be suitably determined, such that the contact hole etch process can stop on the landing liner layer 596, and the landing liner layer 596 can prevent the contact hole etch process from etching layers underneath the landing liner layer 596, such as the insulating layer 525, and the like. In an example, the landing liner layer 596 is formed of silicon nitride (SiN). In another example, the landing liner layer 596 is formed of nitrogen-doped carbon (NDC).

In FIG. 5, the connection portion 501A includes a channel contact structure 590A and the channel plug 540A. The channel contact structure 590A and the channel plug 540A are conductively connected with success. The channel contact structure 590A can connect the drain terminal of the vertical memory cell string 581A to a bit line (BL).

Specifically, in some examples, the channel plug 540A is recessed from the top of the channel hole 531U before a deposition of the landing liner layer 596. For example, originally, the channel plug 540A extends to the top of the channel hole 531U. Then, a portion of the channel plug 540A has been removed from the top of the channel hole 531U. The recessed space of the channel plug 540A from the top of the channel hole 531U is referred to as a recess 591A.

When the landing liner layer 596 is deposited, the landing liner layer 596 is laid in the recess 591A, for example on the sidewalls of the recess 591A and on the bottom of the recess 591A. A portion of the landing liner layer 596 at the bottom of the recess 591A is shown by 596B, and a portion of the landing liner layer on the insulating layer 525 is shown by 596T. The channel contact structure 590A is formed in the isolation stack 595A, and at least a portion of the channel contact structure 590A is landed in the recess 591A and is connected to the channel plug 540A via an opening 598 of the landing liner layer 596B. The opening 598 of the landing liner layer 596B can be formed using a physical argon ion bombardment based etching process that is referred to as a punch process in some examples.

It is noted that the landing liner layer 596 is in touch with the channel plug 540A at the bottom of the recess 591A, the opening 598 of the landing liner layer 596B at the bottom of the recess 591A can expose the channel plug 540A, thus when the channel contact structure 590A is formed, the channel contact structure 590A can be connected with the channel plug 540A via the opening 598 of the landing liner layer 596B.

According to an aspect of the disclosure, the recess 591A is formed by a polysilicon plug recess process, such as a polysilicon wet etch process, and the recess 591A is self-aligned with the channel plug 540A. When the landing liner layer 596 is deposited, the portion 596B of the landing liner layer 596 in the recess 591A is self-aligned with channel plug 540A. During the contact hole etch process, for example, as long as a portion of the contact hole is landed on the bottom portion 596B of the landing liner layer 596 in the recess 591A, the punch process can form the opening 598, and expose the channel plug 540A. When the channel contact structure 590A is formed in the contact hole, the channel contact structure 590A can be conductively connected with the channel plug 540A via the opening 598 of the landing liner layer 596B. The recess 591A and the portion 596B of the landing liner layer 596 can assist self-alignment of the channel contact structure 590A to the channel plug 540A.

According to an aspect of the disclosure, due to uneven surface (e.g., stress related), a channel contact structure may be failed to be aligned with the corresponding channel plug, and the channel contact structure is failed to be conductively connected with the corresponding channel plug, such as shown by the connection portion 501B.

Specifically, the connection portion 501B includes the channel contact structure 590B and a channel plug 540B of the channel structure 530B. The channel contact structure 590B and the channel plug 540B are failed to be conductively connected. The channel contact structure 590B is offset to the corresponding channel structure 530B, for example, due to stress related uneven surface, and thus the channel contact structure 590B fails to be connected with the channel plug 540B of the channel structure 530B.

The channel structure 530B is similarly configured as the channel structure 530A. The channel plug 540B is similarly configured as the channel plug 540A. The description of the channel structures and the channel plugs has been provided above and will be omitted here for clarity purposes.

In some examples, due to uneven surface, a contact hole pattern for the channel contact structure 590B is misaligned with the channel structure 530B during a lithography process. Then, during the contact hole etch process to form a contact hole according to the contact hole pattern, the landing liner layer 596, such as the portion 596T of the landing liner layer 596 can prevent etching into the insulating layer 525. When the channel contact structure 590B is formed in the contact hole that misaligns with the channel structure 530B, the insulating layer 525 can isolate the channel contact structure 590B and the top gate layer 523T, and avoid the short circuit between the channel contact structure 590B to the top gate layer 523T.

The channel contact structure 590B fails to be connected with the channel plug 540B of the channel structure 530B, and thus memory cells of the vertical memory cell string 581B will fail for data storage operations.

According to an aspect of the disclosure, the misalignment of the channel contact structure 590B and the channel structure 530B may cause a failure of the vertical memory cell string 581B, but does not affect operations of other vertical memory cell strings in the same sub-array as the vertical memory cell string 581B, that share a portion of the top gate layer 523T with the vertical memory cell string 581B (e.g., the other vertical memory cell strings have no misalignment issue).

In some examples, the semiconductor device 500, such as 3D NAND flash memory die, may have a small number, such as less than 0.1% vertical memory cell strings, that may fail due to misalignment of the channel contact structures to the corresponding channel structures. The semiconductor device 500 can be designed to have enough redundant vertical memory cell strings that can replace the less than 0.1% failed vertical memory cell strings. Thus, the semiconductor device 500 can be counted as a good die, and the misalignment of the channel contact structures to the corresponding channel structures does not cause production yield loss.

It is noted that, in some examples, the recess 591A can be enlarged after a polysilicon recess process, for example to make an alignment of a channel hole pattern for the channel contact structure 590A to the upper portion 530U of the channel structure easier. For example, after a recess process of the channel plug 540A (e.g., an polysilicon etch of a portion of the channel plug), a wet etch process can be used to remove some insulating materials on the sidewall of the recess in order to wider the recess 591A. The wider recess 591A can ease alignment of the contact hole pattern for the channel contact structure 590A to the upper portion 530U of the channel structure.

Figure 6:
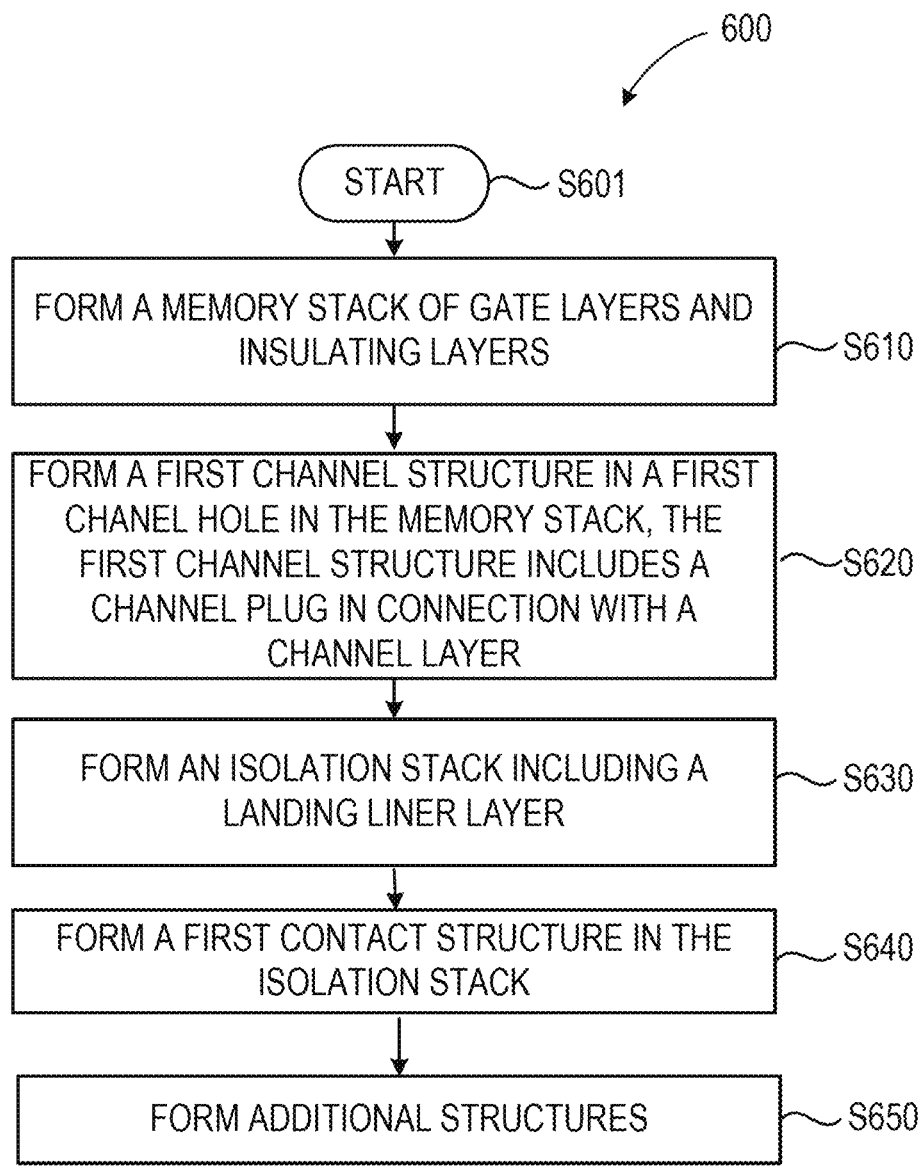
FIG. 6 shows a flow chart outlining a process example for fabricating a semiconductor device.

FIG. 6 shows a flow chart outlining a process example for fabricating a semiconductor device, such as the semiconductor device 100, the semiconductor device 500 and the like.

At S610, a memory stack of gate layers and insulating layers are formed. In the example of the semiconductor device 100, the memory stack 120 is formed. In some embodiments, an initial memory stack that includes sacrificial layers and the insulating layers 121 can be formed. Then, the memory stack 120 can be formed by replacing the sacrificial layers with the gate layers 123 in a later process.

In the example of the semiconductor device 500, the memory stack 520 is formed as a combination of the lower stack 520L, the middle stack 520M and the TSG stack 520U. In an embodiment, an initial lower stack that includes sacrificial layers and the insulating layers 521L can be formed; an initial middle stack that includes sacrificial layers and the insulating layers 521M can be formed; an initial TSG stack that includes sacrificial layers and the insulating layers 521U and 525 can be formed. Then, the memory stack 520 can be formed by replacing the sacrificial layers with the gate layers 523L, 523M and 523U in a later process. In another embodiment, an initial lower stack that includes sacrificial layers and the insulating layers 521L can be formed; an initial middle stack that includes sacrificial layers and the insulating layers 521M can be formed; the TSG stack 520U that includes the gate layers 523U and the insulating layers 521U and 525 can be formed. Then, the memory stack 520 can be formed by replacing the sacrificial layers in the initial lower stack and the middle stack with the gate layers 523L and 523M in a later process.

At S620, a first channel structure is formed. The first channel structure extends through a first channel hole in the memory stack. The first channel structure includes a channel plug in connection with a channel layer of the first channel structure. In the example of the semiconductor device 100, the channel structure 130A is formed in the memory stack 120. The channel structure 130A includes a channel plug 140A in connection with the channel layer of the channel structure 130A. In the example of the semiconductor device 500, the channel structure 530A is formed in the memory stack 520. The semiconductor device 500 includes a channel plug 540A in connection with the channel layer of the channel structure 530A.

At S630, an insolation stack is formed. The isolation stack includes a landing liner layer and an isolation layer. A first portion of the landing liner layer is laid on the channel plug. In some examples, the isolation layer is formed of silicon oxide, and the landing liner layer is formed of silicon nitride and/or nitrogen-doped carbon (NDC). In the example of the semiconductor device 100, the isolation stack 195 includes the landing liner layer 196 and the isolation layer 197. The landing liner layer 196 includes a portion 196B laid on the channel plug 140A. In the example of the semiconductor device 500, the isolation stack 595 includes the landing liner layer 596 and the isolation layer 597. The landing liner layer 596 includes a portion 596B laid on the channel plug 540A.

In some examples, the first channel structure is recessed in the first channel hole, and the landing liner layer covers a sidewall and a bottom of a recess by the first channel structure and the first portion of the landing liner layer is laid on the channel plug at the bottom of the recess. In the example of the semiconductor device 100, the recess 191A is formed by recessing the channel plug 140A. The landing liner layer 196 can cover the sidewall and the bottom of the recess 191A. In the example of the semiconductor device 500, the recess 591A is formed by recessing the channel plug 540A. The landing liner layer 596 can cover the sidewall and the bottom of the recess 591A.

In an example, the recess is aligned with the channel plug, such as shown in FIG. 1. In another example, the recess is wider than the channel plug, such as shown in FIG. 3 and FIG. 5.

In some examples, the first channel structure includes a blocking insulating layer, a charge storage layer, and a tunneling insulating layer between the channel layer of the first channel structure and a top gate layer in the memory stack, such as shown in FIG. 1. In some other examples, the first channel structure includes an insulating layer between the channel layer of the first channel structure and a top gate layer in the memory stack, such as shown in FIG. 5.

At S640, a first contact structure is formed in the isolation stack. The first contact structure is connected to the channel plug via an opening in the first portion of the landing liner layer on the channel plug. In the example of the semiconductor device 100, the channel contact structure 190A is formed in the isolation stack 195. The channel contact structure 190A is connected to the channel plug 140A via the opening 198 in the portion 196B of the landing liner layer 196. In the example of the semiconductor device 500, the channel contact structure 590A is formed in the isolation stack 595. The channel contact structure 590A is connected to the channel plug 540A via the opening 598 in the portion 596B of the landing liner layer 596.

In some examples, the landing liner layer includes a second portion on a top insulating layer on a top gate layer in the memory stack. Due to misalignment, a second contact structure can be formed in the isolation stack with a bottom landed in the second portion of the landing liner layer. The second contact structure is isolated from the top gate layer by the top insulating layer in the memory stack. In the example of the semiconductor device 100, the channel contact structure 190B is misaligned with the channel structure 130B, and can land in the portion 196T of the landing liner layer 196. In the example of the semiconductor device 500, the channel contact structure 590B is misaligned with the channel structure 530B, and can land in the portion 596T of the landing liner layer 596.

At S650, additional structures can be formed in the semiconductor device.

It is noted that the process 600 can be suitably adapted. Step(s) in the process 600 can be modified and/or omitted. Additional step(s) can be added. Any suitable order of implementation can be used.

FIGS. 7A-7H show cross-sectional views of a semiconductor device, such as the semiconductor device 100, at various intermediate steps of wafer level manufacturing, in accordance with some embodiments of the present disclosure.

Figure 7A:
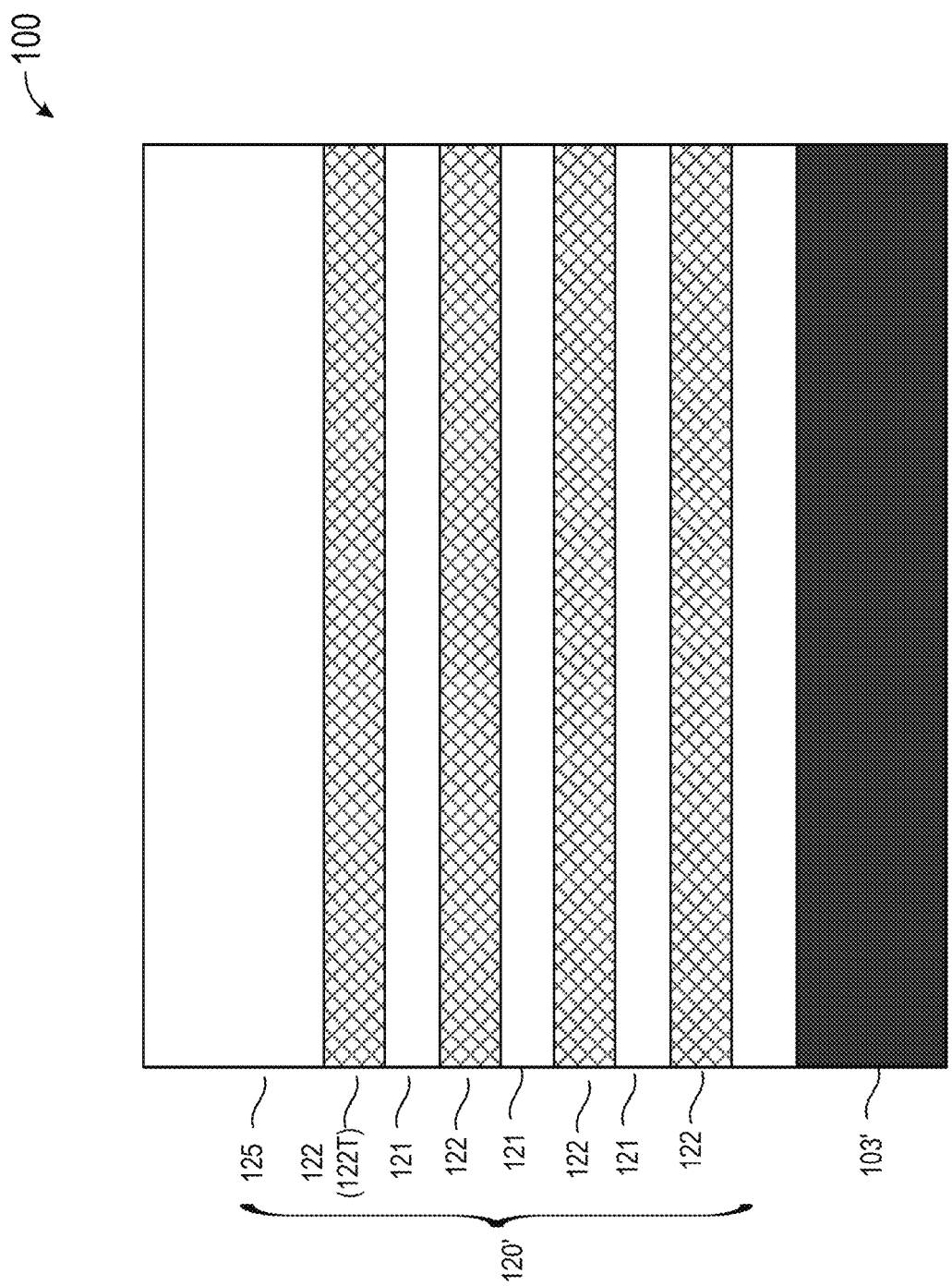
FIGS. 7A-7H show cross-sectional views of a semiconductor device at various intermediate steps of manufacturing in accordance with some embodiments of the present disclosure.

FIG. 7A shows a cross-sectional view of the semiconductor device 100 after a deposition of an initial memory stack 120' of layers on a substrate 103'. In the FIG. 7A example, the initial memory stack 120' includes sacrificial layers 122 and insulating layers 121 that are stacked alternatingly on the substrate 103'. The substrate 103' can any suitable substrate, such as a silicon (Si) substrate, polysilicon, a germanium (Ge) substrate, a silicon-germanium (SiGe) substrate, a Group IV semiconductor, a Group III-V compound semiconductor, and the like. The substrate 103' may be a bulk wafer or an epitaxial layer. In some examples, the substrate 103' is the semiconductor layer 103 in the final semiconductor device 100. In some examples, the substrate 103' is removed during fabrication, the semiconductor layer 103 is formed in the final semiconductor device 100.

In some examples, the sacrificial layers 122 are formed of silicon nitride, and the insulating layers 121 are formed of silicon dioxide. The sacrificial layers 122 can be replaced by the gate layers 123 in a later process.

In the FIG. 7A example, the top sacrificial layer in the memory stack is shown by the top sacrificial layer 122T, and can be replaced by the top gate layer 123T in the later process. The initial memory stack 120' includes an insulating layer 125 on the top sacrificial layer 122T. In some examples, the insulating layer 125 has a higher thickness than respective insulating layer 121.

Figure 7B:
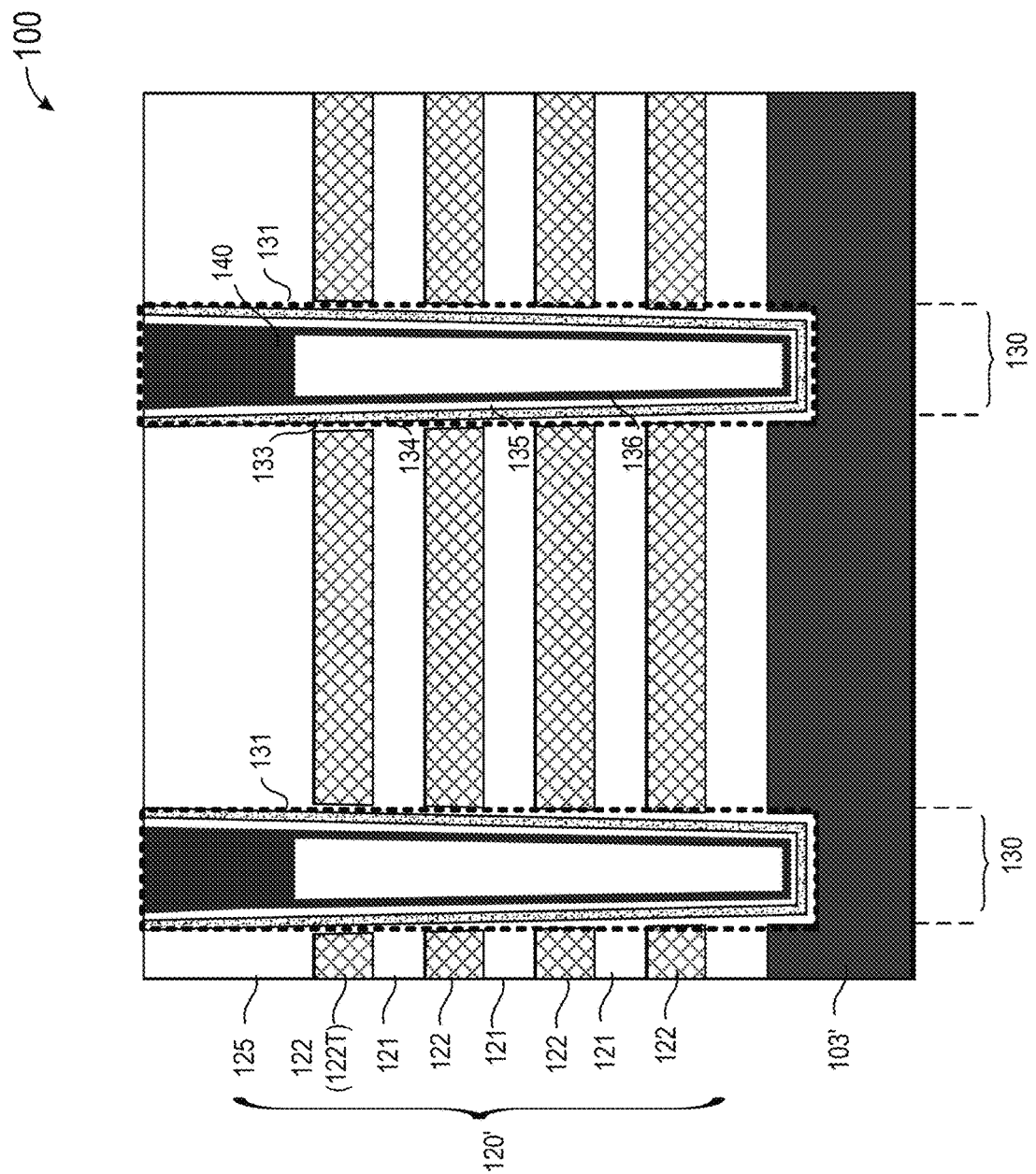

FIG. 7B shows a cross-sectional view of the semiconductor device 100 after channel structures 130 are formed in the initial memory stack 120'.

In some examples, channel holes 131 for the channel structures 130 are formed in the initial memory stack 120' and the channel structures 130 are formed in the channel holes 131. In an example, patterns for the channel structures 130 can be defined in photoresist or hard mask layer, and then the patterns can be transferred into the initial memory stack 120' as channel holes 131 using suitable etch process.

Further, in some examples, the blocking insulating layer 133 (e.g., silicon oxide) is formed on the sidewall of the channel holes 131, and then the charge storage layer 134 (e.g., silicon nitride), the tunneling insulating layer 135, the channel layer 136, and the insulating layer 137 are sequentially stacked from the sidewall. The channel layer 136 can be any suitable semiconductor material, such as polysilicon or monocrystalline silicon, and the semiconductor material may be un-doped or may include a p-type or n-type dopant. The channel layer 136 is also referred to as a semiconductor layer in some examples. In some examples, the semiconductor material is intrinsic silicon material that is un-doped. However due to defects, intrinsic silicon material can have a carrier density in the order of $10^{10}$ cm$^{-3}$ in some examples. The insulating layer 137 is formed of an insulating material, such as silicon oxide and/or silicon nitride, and/or may be formed as an air gap.

Further, in some examples, the channel plug 140 is formed in a top portion of the channel hole 131. The channel plug 140 is formed of a semiconductor material, such as doped (p-type doped or n-type doped) polysilicon, and the like. In an example, a top portion of the insulating layer 137 is removed to form a recess for the channel plug 140, and then semiconductor material for the channel plug 140 can be deposited to fill the recess, and then excess semiconductor material can be removed, for example by chemical mechanical polishing process.

Figure 7C:
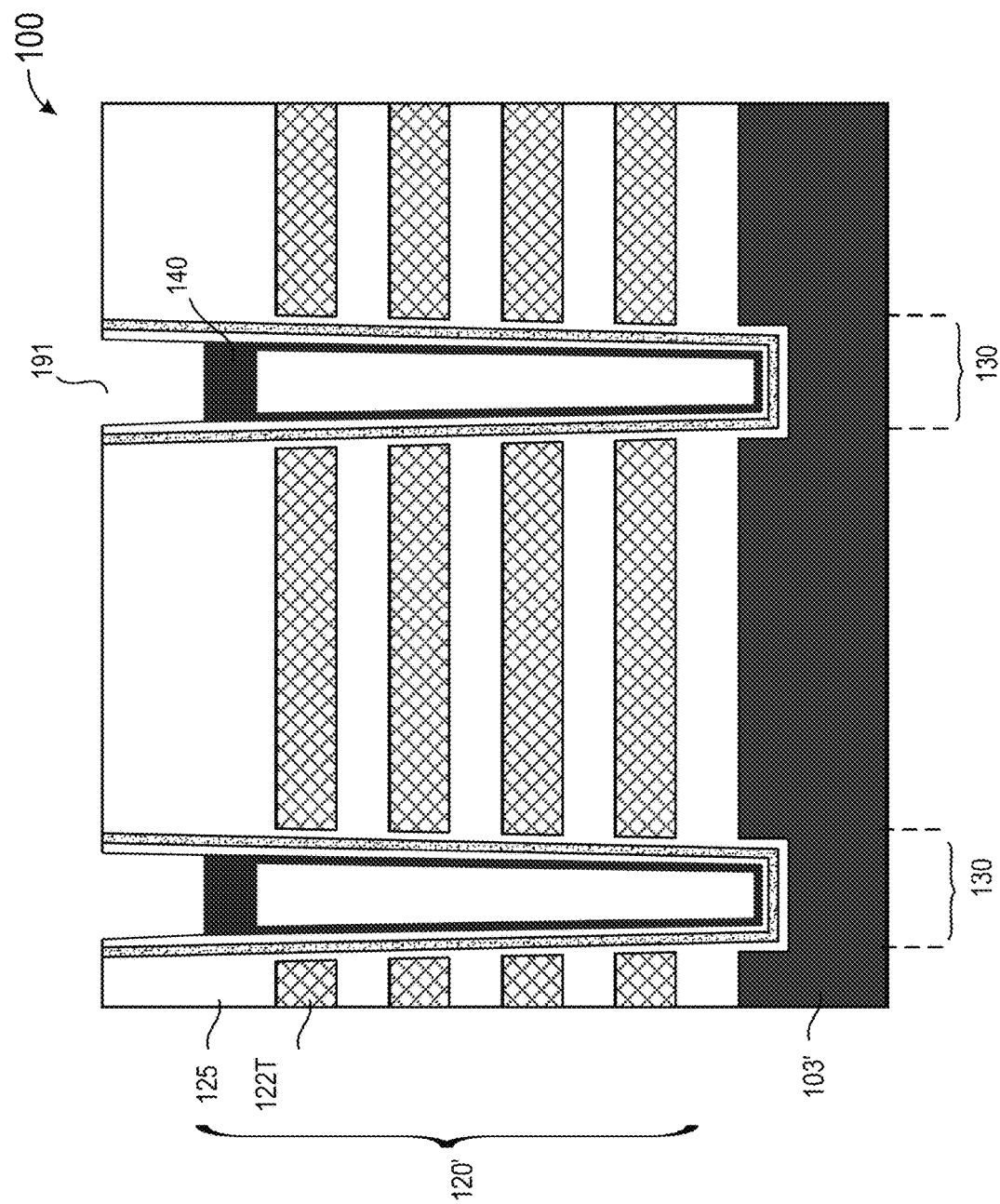

FIG. 7C shows a cross-sectional view of the semiconductor device 100 after a recess 191 is respectively formed in the channel plugs 140. In some examples, a suitable etch process, such as an etch process that has relatively large selectivity of polysilicon to silicon dioxide (e.g., etch rate of polysilicon is over 10 times larger than the etch rate of the silicon dioxide), can be used to form the recess 191. In an example, a wet etch can be used. The recess 191 is self-aligned to a corresponding channel plug 140.

Figure 7D:
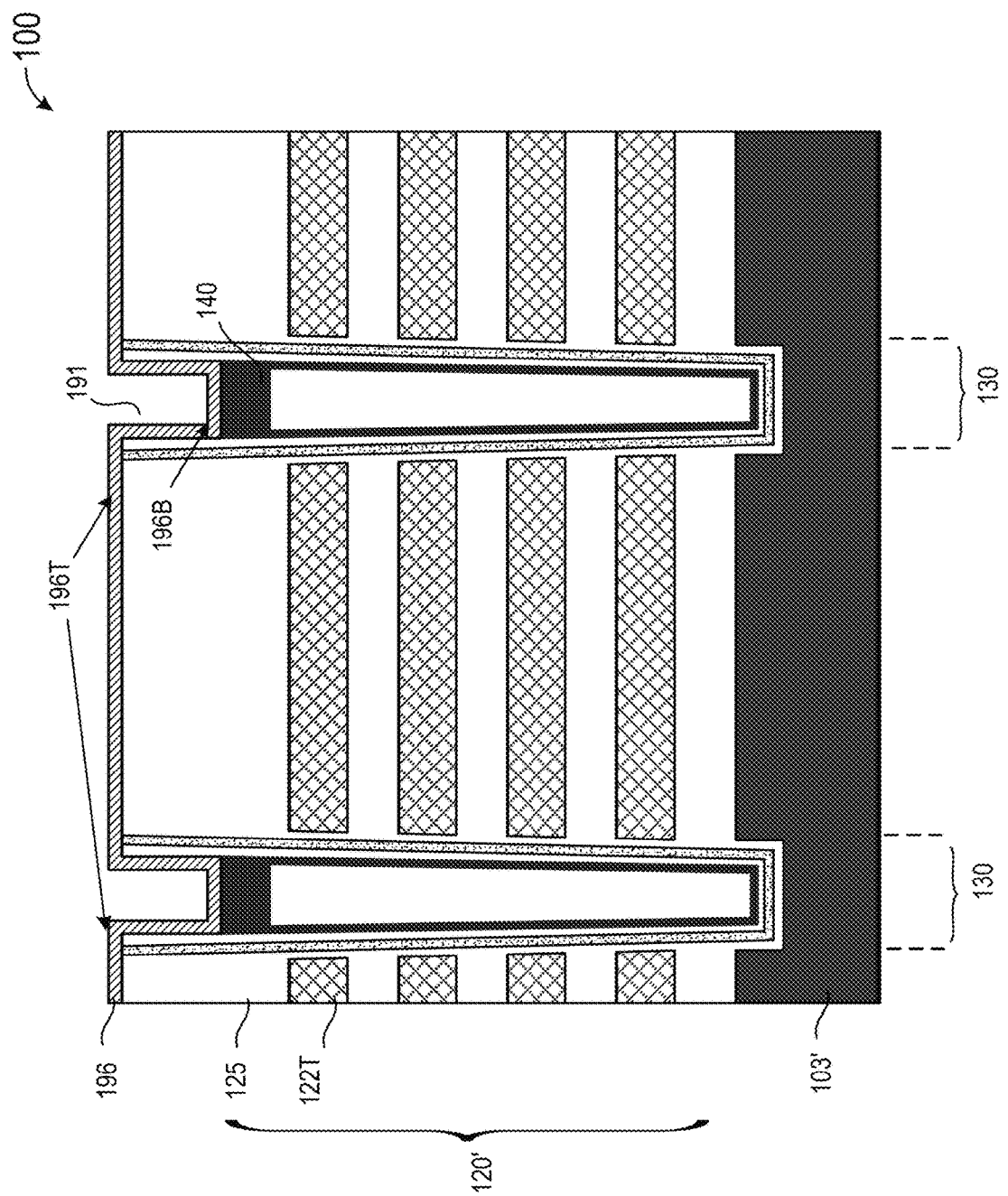

FIG. 7D shows a cross-sectional view of the semiconductor device 100 after a landing liner layer 196 is formed. In an example, the landing liner layer 196 is formed of silicon nitride. In another example, the landing liner layer 196 is formed of nitrogen-doped carbon (NDC). The landing liner layer 196 can be formed by any suitable deposition process, such as atomic layer deposition (ALD) process and the like. The landing liner layer 196 is laid on the channel plug 140 at the bottom of the recess 191. The landing liner layer 196 is also formed on the sidewall of the recess 191 and on the insulating layer 125. The landing liner layer 196 includes a portion 196B laid on the channel plug 140 at the bottom of the recess 191, and includes a portion 196T laid on the insulating layer 125.

Figure 7E:
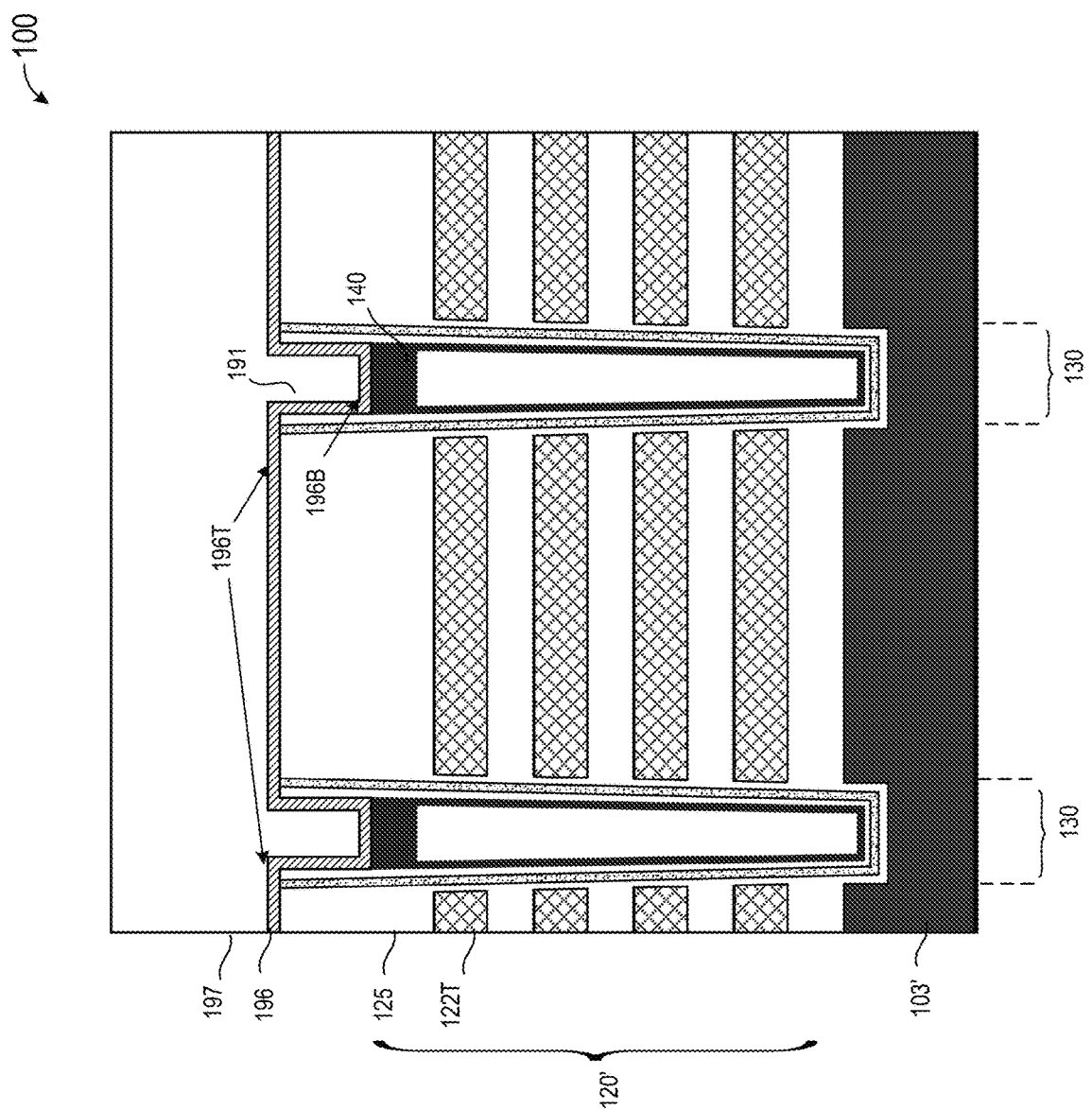

FIG. 7E shows a cross-sectional view of the semiconductor device 100 after an (contact) isolation layer 197 is formed. In an example, the isolation layer 197 is formed of silicon dioxide, and can be formed using any suitable deposition process. It is noted that the recess 191 can be filled by the isolation layer 197. It is also noted that additional process, such as CMP process, may be performed to planarize surface.

Figure 7F:
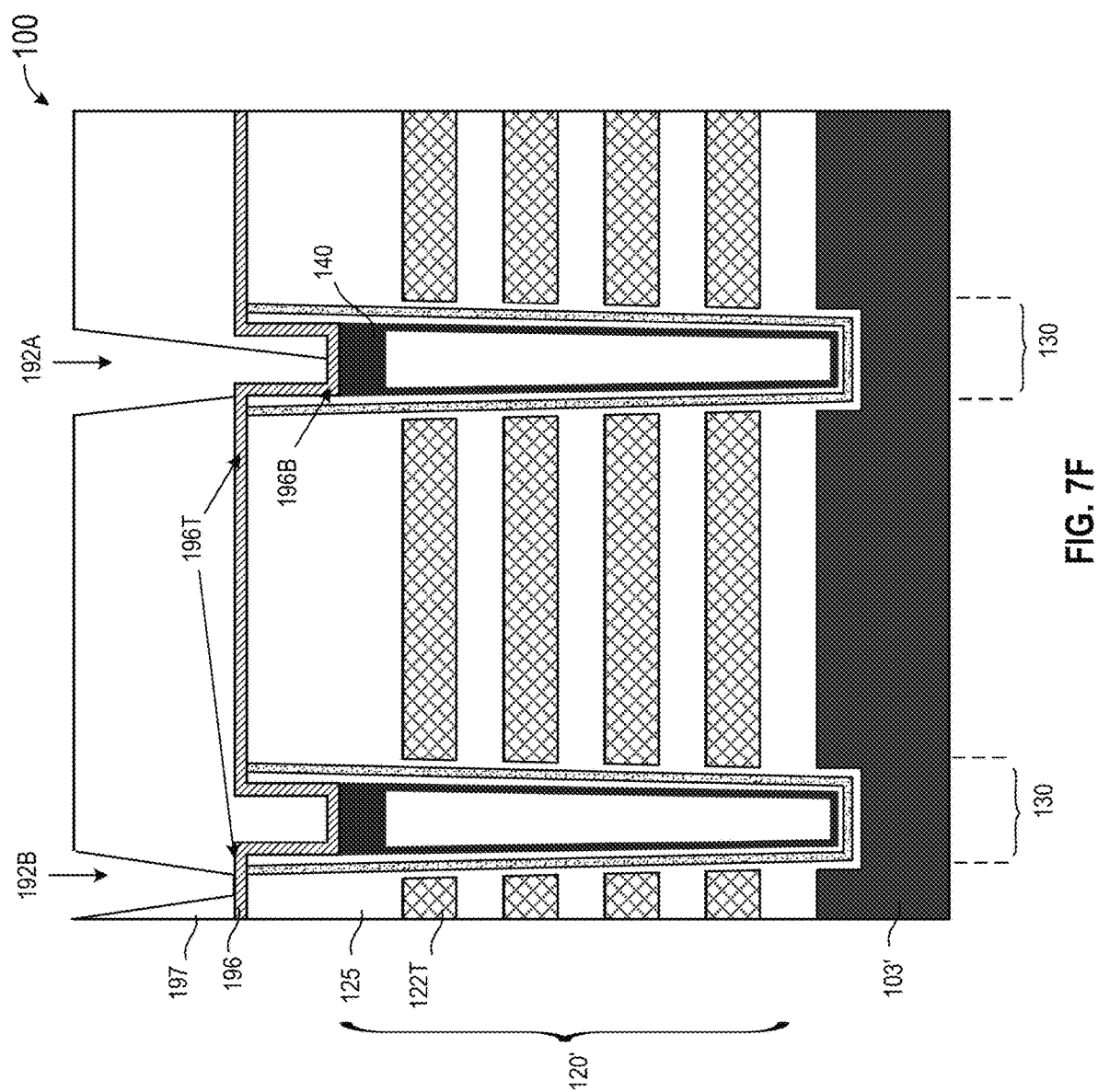

FIG. 7F shows a cross-sectional view of the semiconductor device 100 after contact holes 192 (shown by 192A and 192B) are formed in the isolation layer 197. In an example, patterns of the contact holes 192 can be defined in photoresist or hard mask layer, then the patterns can be transferred into the isolation layer 197 using an etch process. In some examples, a suitable etch process, such as an etch process that has relatively large selectivity of the isolation layer 197 to the landing liner layer 196 (e.g., etch rate of the isolation layer 197 is over 10 times larger than the etch rate of the landing liner layer 196, such as is about 15 times, 20 times or 30 times of the etch rate of the landing liner layer 196), can be used to form the contact holes 192 in the isolation layer 197. The etch can stop on the landing liner layer 196.

According to an aspect of the disclosure, when the patterns of the contact holes 192 are aligned well with the channel structures 130, the contact holes 192, such as shown by 192A, can land on the portion 196B of the landing liner layer 196. In some examples, when a pattern of a contact hole is misaligned with a corresponding channel structure 130, the contact hole 192, such as shown by 192B may land on a portion 196T of the landing liner layer 196.

Figure 7G:
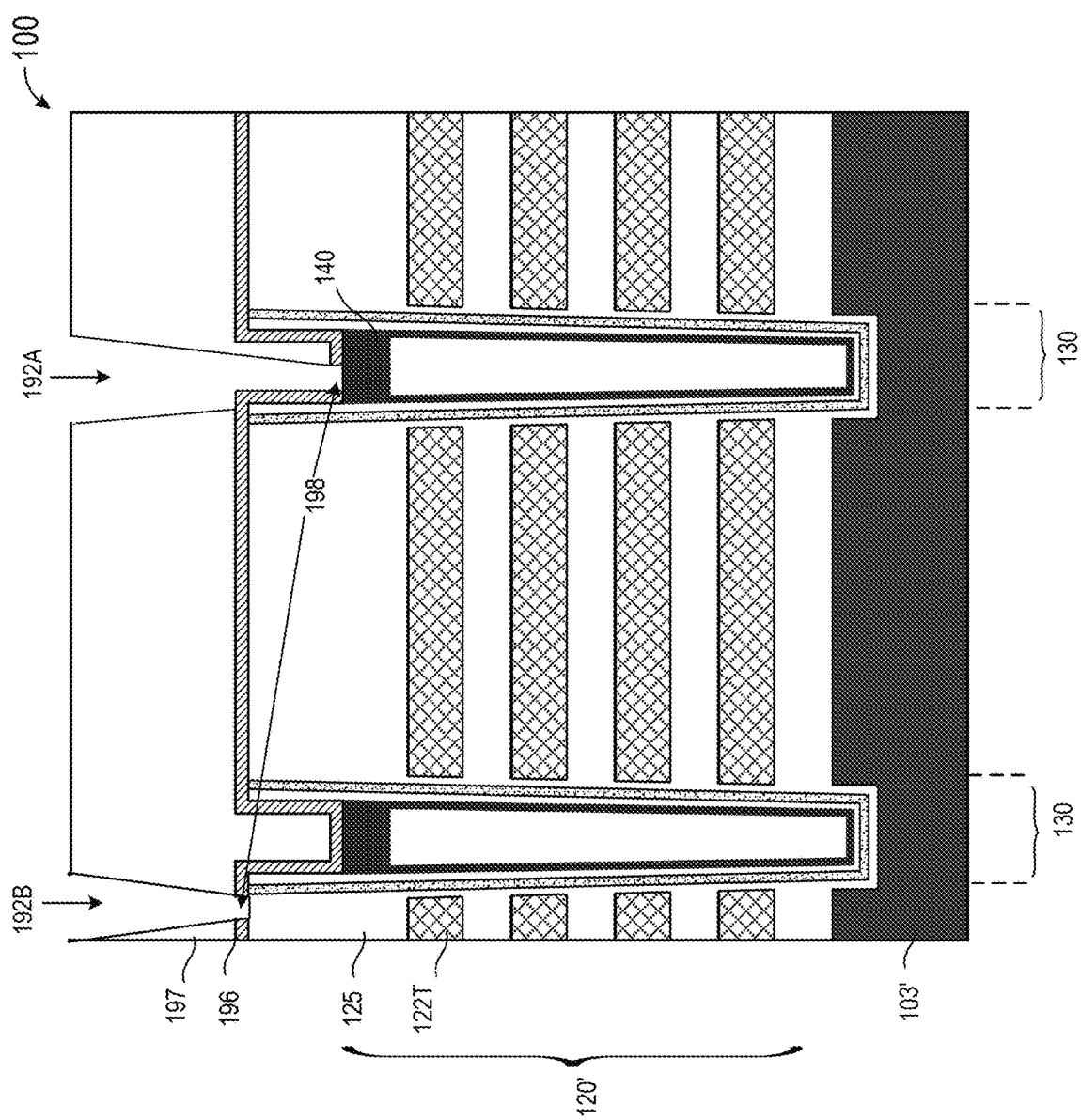

FIG. 7G shows a cross-sectional view of the semiconductor device 100 after openings 198 are formed in the landing liner layer 196 based on the contact holes 192. In some examples, the openings 198 are formed by a physical argon ion bombardment based etching process that is referred to as punch process. The punch process can remove a portion of the landing liner layer 196 that are exposed by the contact holes 192. During the punch process, the isolation layer 197 is used as a mask layer to etch the portion of the landing liner layer 196 that are exposed by the contact holes 192 to achieve self-alignment to the channel plugs 140. The openings 198 can expose the channel plugs 140 when the contact holes 192 are aligned with the channel structures 130.

Figure 7H:
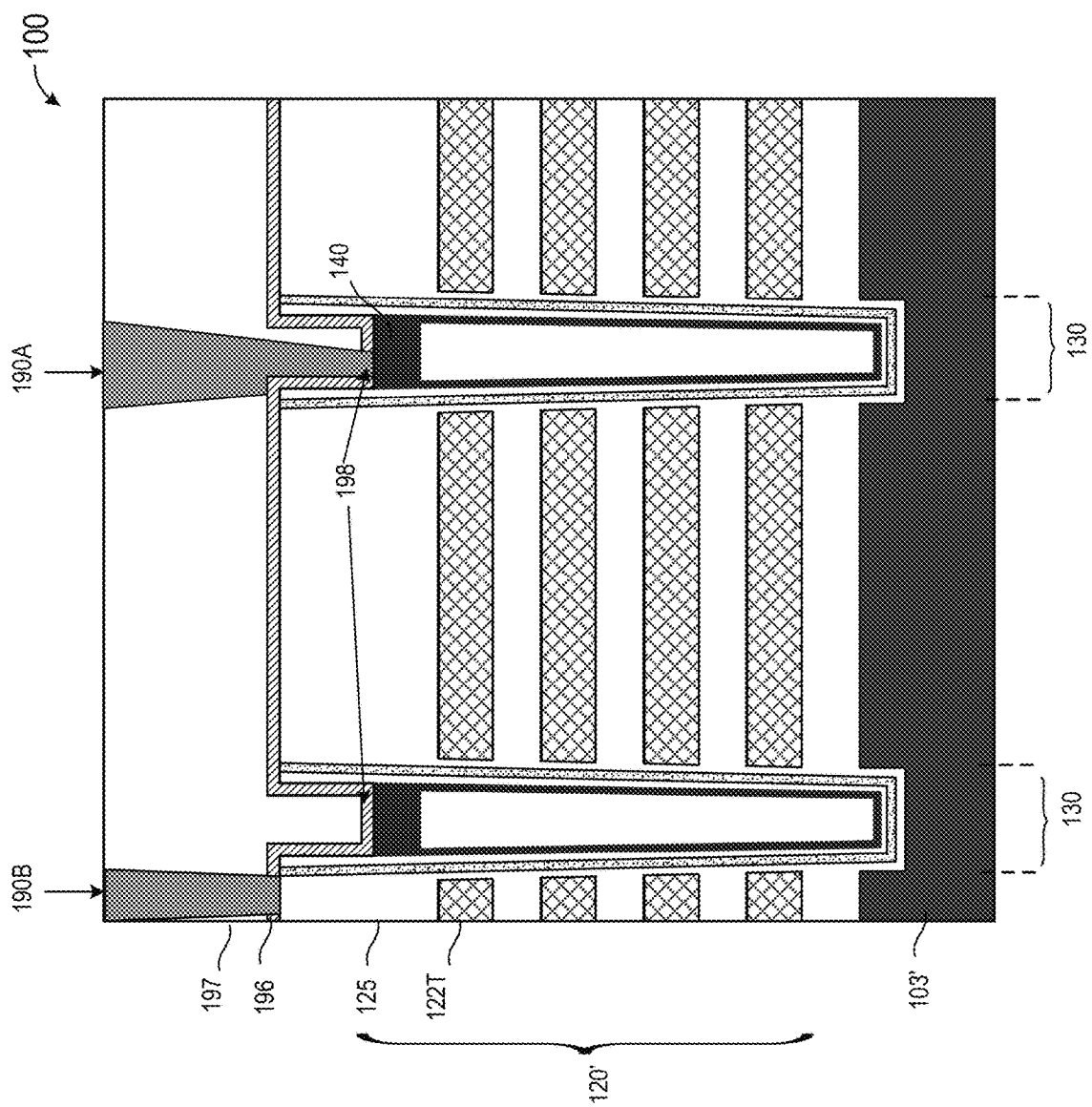

FIG. 7H shows a cross-sectional view of the semiconductor device 100 after channel contact structures 190 (shown by 190A and 190B) are formed in the contact holes. In some examples, suitable conductive materials, such as titanium (Ti), titanium nitride (TiN), tungsten, and the like, are deposited in the contact holes, and then excess conductive materials can be removed, for example by CMP process to form the channel contact structures 190. The channel contact structures 190, such as shown by the channel contact structure 190A, can be connected to the channel plug 140 based on the openings 198.

It is noted that when the channel holes 192 are misaligned with the channel structures 130, the insulating layer 125 can isolate the channel contact structure 190, such as the channel contact structure 190B from the top sacrificial layer 122T which will be replaced by top gate layer 123T in a later process.

It is noted that further processing, such as replacement of sacrificial layers 122 with gate layer 123, forming ACS and the like can be performed to generate the final semiconductor device 100 shown in FIG. 1.

FIGS. 8A-8F show cross-sectional views of a semiconductor device, such as the semiconductor device 500, at various intermediate steps of wafer level manufacturing, in accordance with some embodiments of the present disclosure.

Figure 8A:
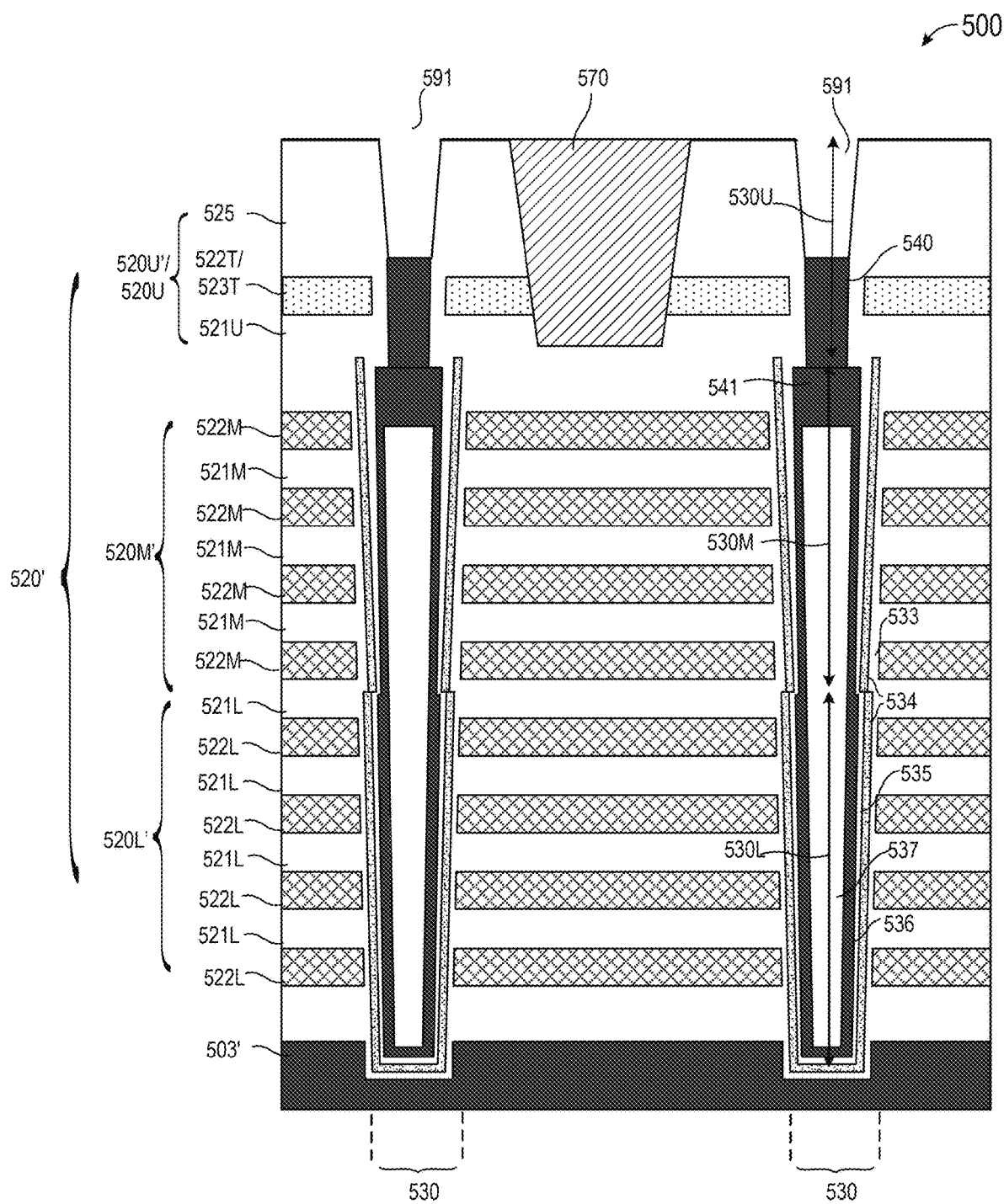
FIGS. 8A-8F show cross-sectional views of another semiconductor device at various intermediate steps of manufacturing in accordance with some embodiments of the present disclosure.

FIG. 8A shows a cross-sectional view of the semiconductor device 500 after recess 591 is formed in corresponding channel plugs 540.

In some examples, an initial memory stack 520' is formed and channel structures 530 are formed in the initial memory stack 520'. In an embodiment, an initial lower stack 520L' that includes sacrificial layers 522L and the insulating layers 521L can be formed, and lower channel holes can be formed in the initial lower stack 520L'. The lower channel holes are filed with sacrificial material in an example. Then, an initial middle stack 520M' that includes sacrificial layers 522M and the insulating layers 521M can be formed. The middle channel holes can be formed in the initial middle stack 520M'. The middle channel holes can expose the sacrificial material in the lower channel holes. The sacrificial material can be removed, and the middle channel holes and the lower channel holes can be combined into combined channel holes. Then, the middle portion 530M and the lower portion 530L can be formed in the combined channel holes. In an example, the blocking insulating layer 533 (e.g., silicon dioxide) is formed on the sidewall of the combined channel holes, and then the charge storage layer (e.g., silicon nitride) 534, the tunneling insulating layer 535, the channel layer 536, and the insulating layer 537 are sequentially stacked from the sidewall of the combined channel holes.

Further, in some examples, the intermediate channel plugs 541 can be formed at the top of the middle portion 530M of the channel structures 530. To form the intermediate channel plug 541, in an example, a top portion of the insulating layer 537 is removed to form a recess, and then semiconductor material for the intermediate channel plug 541 can be deposited to fill the recess, and then excess semiconductor material can be removed, for example by chemical mechanical polishing process.

In an embodiment, an initial TSG stack 520U' that includes sacrificial layers 522 and the insulating layers 521U and 525 can be formed. The sacrificial layers 522 can be replaced by the gate layers 523 in a later process. In another embodiment, the TSG stack 520U that includes the gate layers 523U and the insulating layers 521U and 525 can be formed. Then, the upper portion 530U can be formed in the initial TSG stack 520U' or the TSG stack 520. In an example, upper channel holes can be etched into the initial TSG stack 520U' or the TSG stack 520U. The upper channel holes can expose the intermediate channel plugs 542. In an example, the insulating layer 538 (e.g., silicon oxide) is formed on the sidewall of an upper channel hole 531U for the upper portion 530U, and then the channel plug 540 can be formed. In an example, to form the channel plug 540, polysilicon is deposited, and excess polysilicon can be removed by CMP process. The channel plug 540 is connected with the intermediate channel plug 541.

In some examples, a suitable etch process, such as an etch process that has relatively large selectivity of silicon to silicon dioxide (e.g., etch rate of silicon is over 10 times larger than the etch rate of the silicon dioxide), can be used to form the recess 591. In an example, a wet etch can be used. The recess 591 is self-aligned to a corresponding channel plug 540.

In some examples, after the recess process of the channel plug 540, a wet etch process can be used to remove some insulating material on the sidewall of the recess 591 in order to enlarge the recess 591.

It is noted, in some example, the TSG cut structures 570 can be formed before the forming of the recess 591. In some other examples, the TSG cut structures 570 can be formed at a later stage.

Figure 8B:
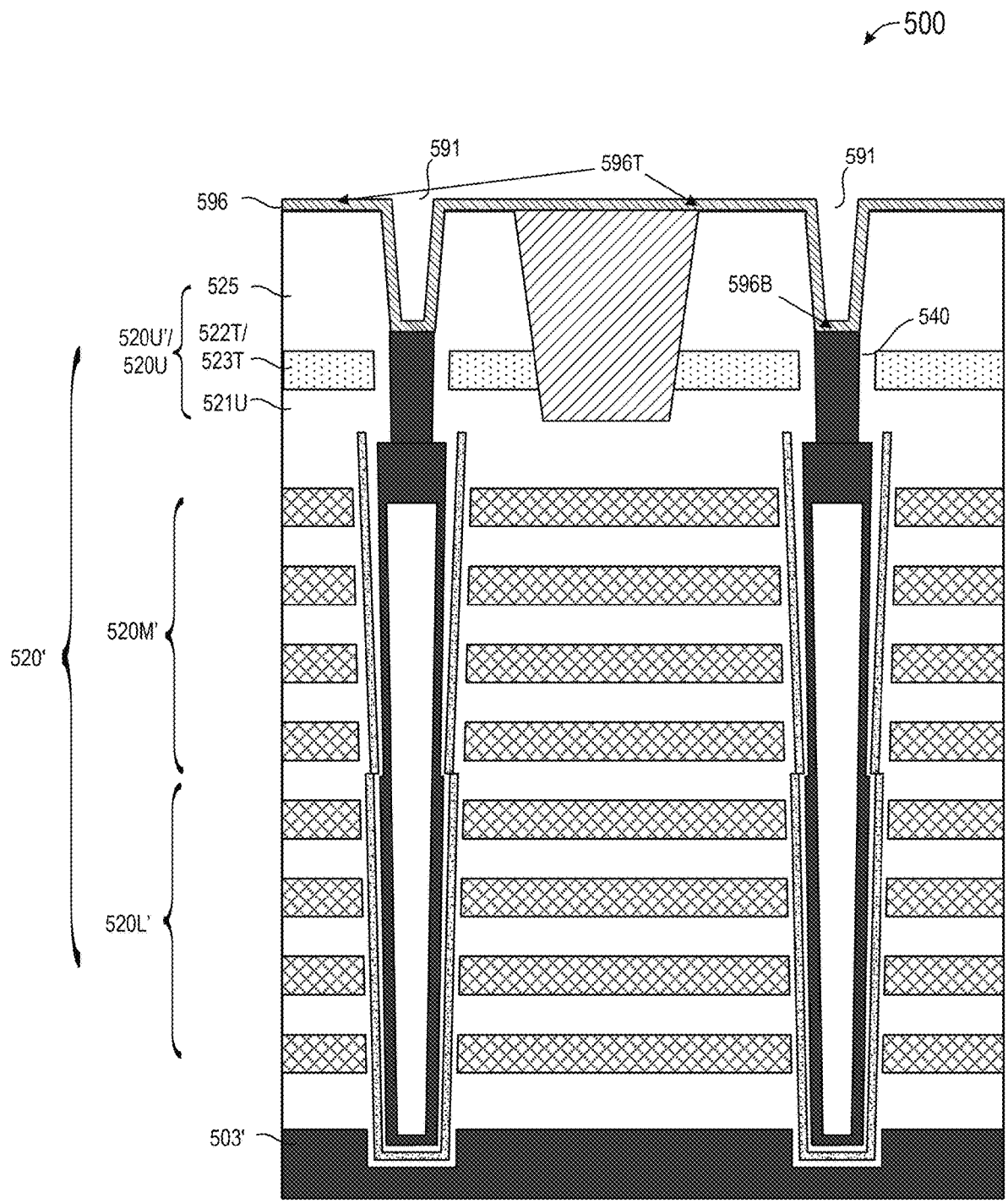

FIG. 8B shows a cross-sectional view of the semiconductor device 500 after a landing liner layer 596 is formed. In an example, the landing liner layer 596 is formed of silicon nitride. In another example, the landing liner layer 596 is formed of nitrogen-doped carbon (NDC). The landing liner layer 596 can be formed by any suitable deposition process, such as atomic layer deposition (ALD) process and the like. The landing liner layer 596 is laid on the channel plug 540 at the bottom of the recess 591. The landing liner layer 596 is also formed on the sidewall of the recess 591 and on the insulating layer 525. The landing liner layer 596 includes a portion 596B laid on the channel plug 540 at the bottom of the recess 591, and includes a portion 596T laid on the insulating layer 525.

Figure 8C:
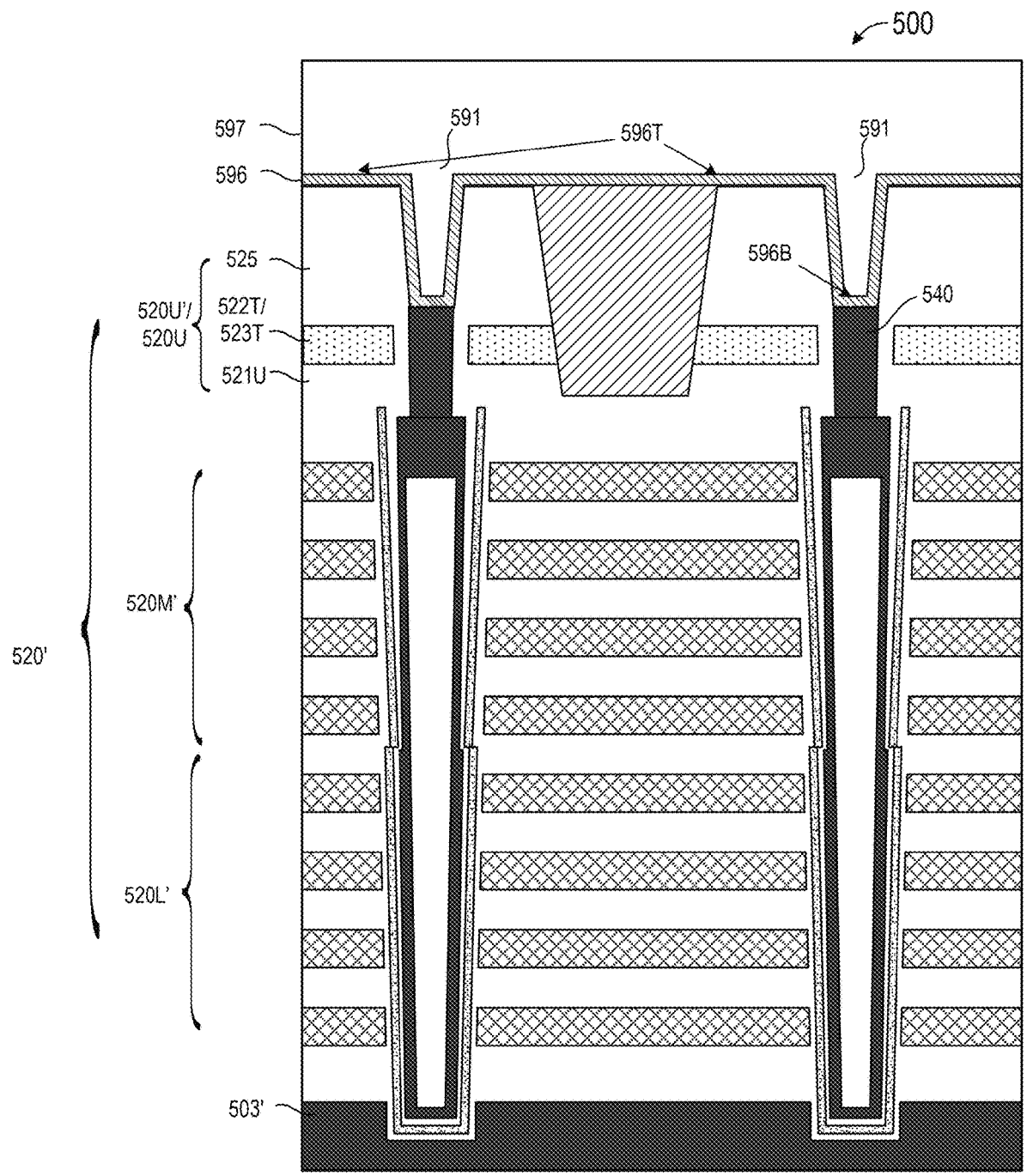

FIG. 8C shows a cross-sectional view of the semiconductor device 500 after an (contact) isolation layer 597 is formed. In an example, the isolation layer 597 is formed of silicon dioxide, and can be formed using any suitable deposition process. It is noted that the recess 591 can be filled by the isolation layer 597. It is also noted that additional process, such as CMP process, may be performed to planarize surface.

Figure 8D:
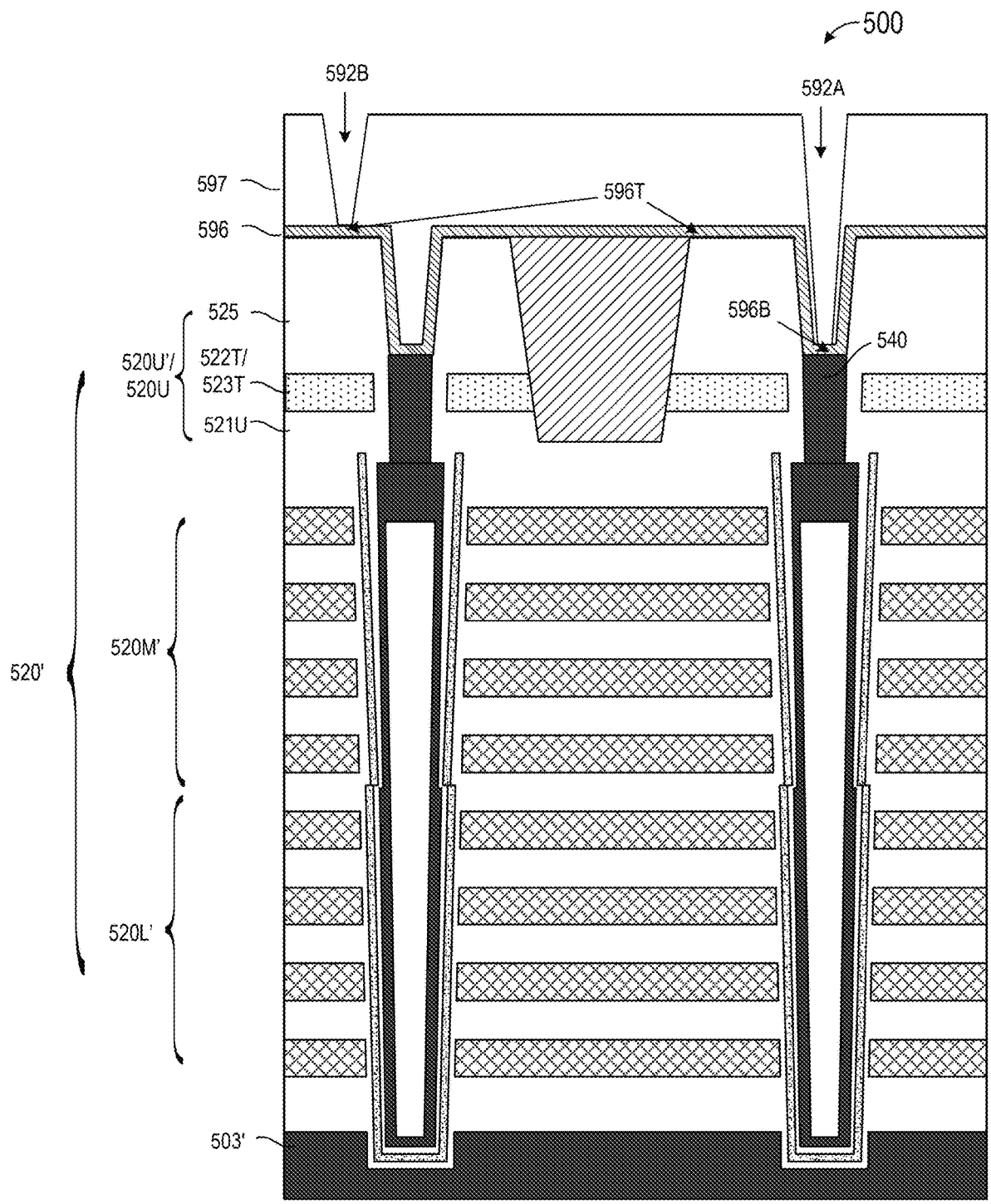

FIG. 8D shows a cross-sectional view of the semiconductor device 500 after contact holes 592 (shown by 592A and 592B) are formed in the isolation layer 597. In an example, patterns of the contact holes 592 can be defined in photoresist or hard mask layer, then the patterns can be transferred into the isolation layer 597 using an etch process. In some examples, a suitable etch process, such as an etch process that has relatively large selectivity of the isolation layer 597 to the landing liner layer 596 (e.g., etch rate of the isolation layer 597 is over 10 times larger than the etch rate of the landing liner layer 596), can be used to form the contact holes 592 in the isolation layer 597. The etch can stop on the landing liner layer 596.

According to an aspect of the disclosure, when the patterns of the contact holes 592 are aligned well with the channel structures 530, the contact holes 592, such as shown by 592A, can land on the portion 596B of the landing liner layer 596. In some examples, when a pattern of a contact hole is misaligned with a corresponding channel structure 530, the contact hole 592, such as shown by 592B, may land on a portion 596T of the landing liner layer 596.

Figure 8E:
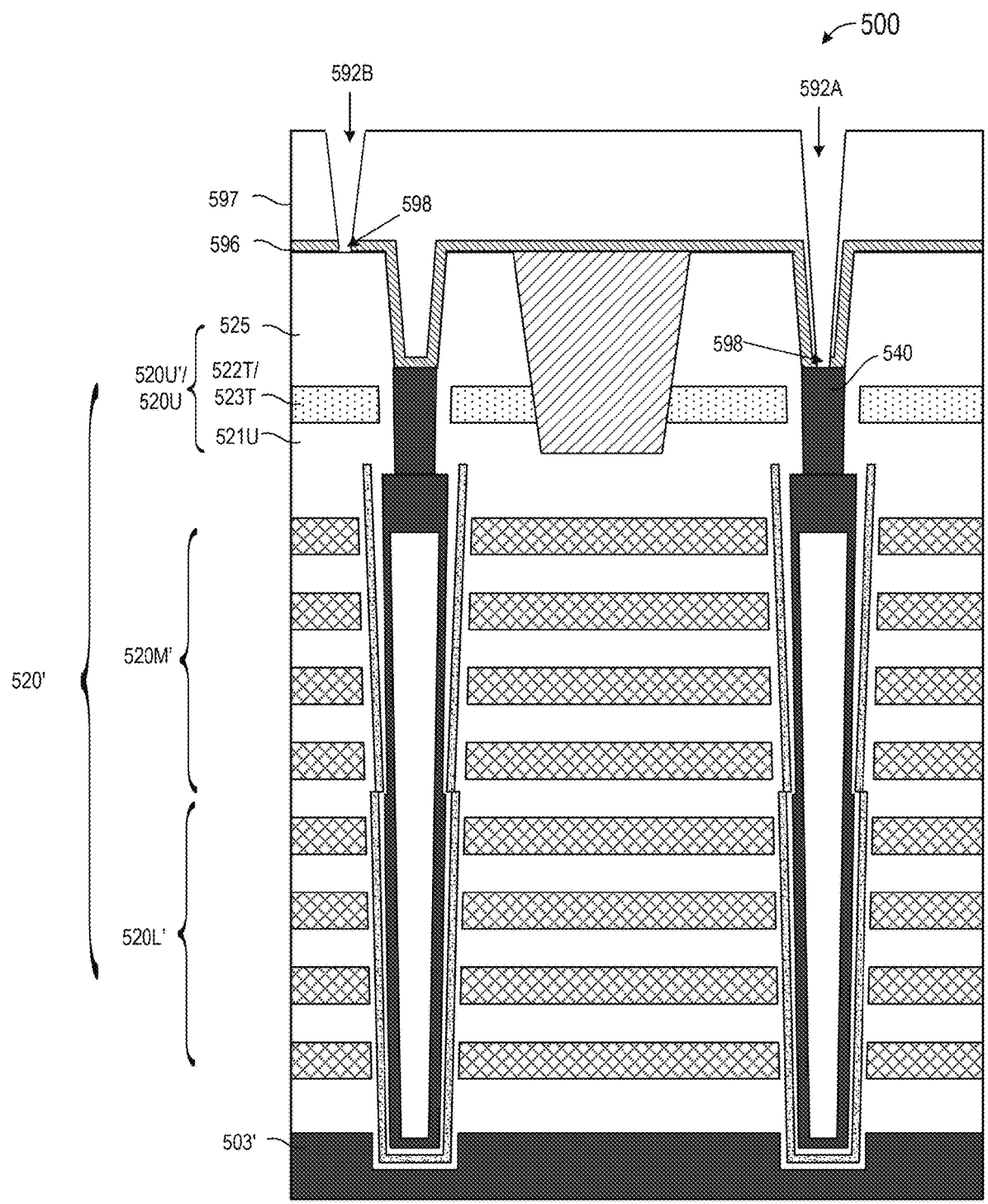

FIG. 8E shows a cross-sectional view of the semiconductor device 500 after openings 598 are formed in the landing liner layer 596 based on the contact holes 592. In some examples, the openings 598 are formed by a physical argon ion bombardment based etching process that is referred to as punch process. The punch process can remove a portion of the landing liner layer 596 that are exposed by the contact holes 592. During the punch process, the isolation layer 597 is used as a mask layer to etch the portion of the landing liner layer 596 that are exposed by the contact holes 592 to achieve self-alignment to the channel plugs 540. The openings 598 can expose the channel plugs 540 when the contact holes 592 are aligned with the channel structures 530.

Figure 8F:
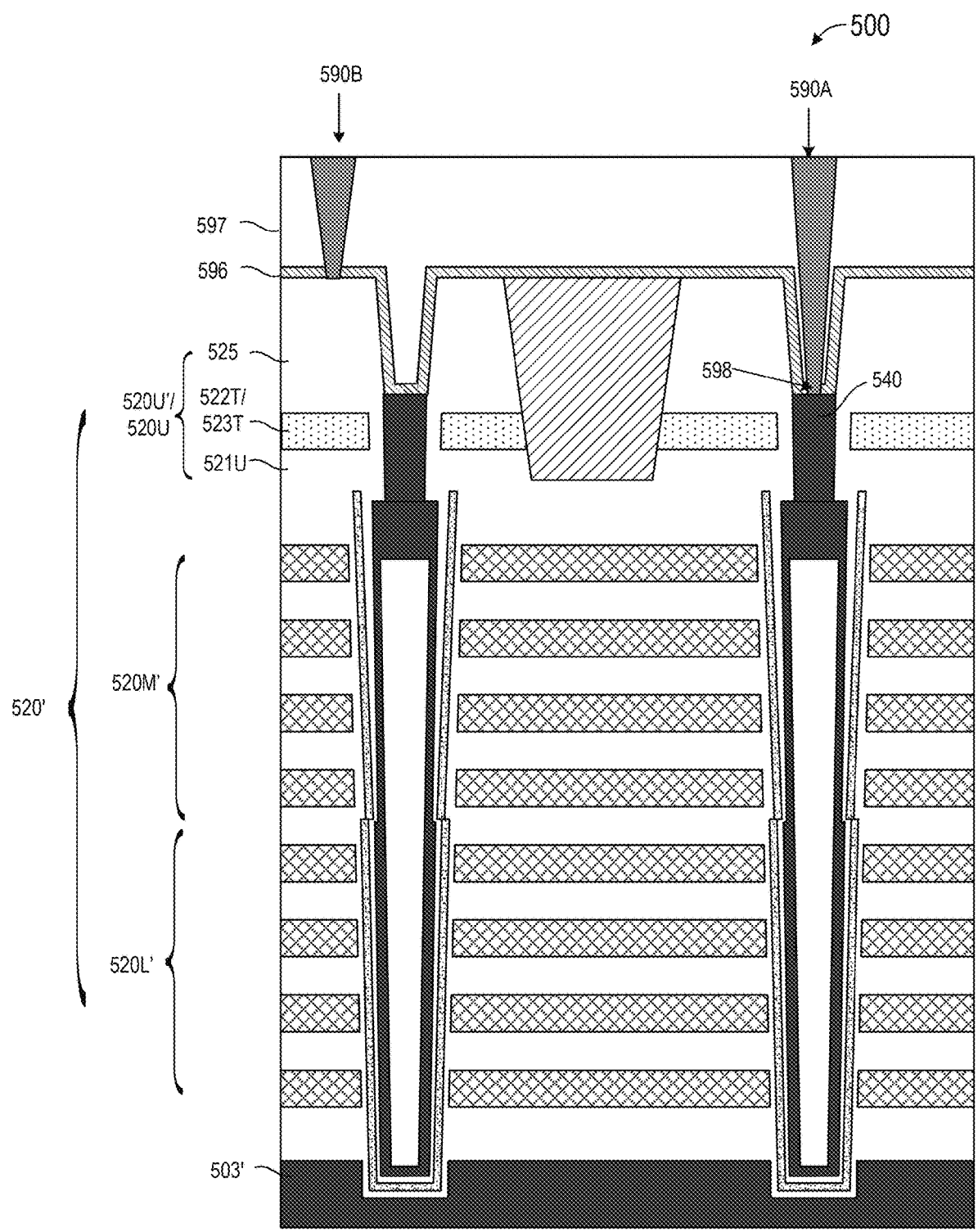

FIG. 8F shows a cross-sectional view of the semiconductor device 500 after channel contact structures 590 (shown by 590A and 590B) are formed in the contact holes. In some examples, suitable conductive materials, such as titanium (Ti), titanium nitride (TiN), tungsten, and the like, are deposited in the contact holes, and then excess conductive materials can be removed, for example by CMP process to form the channel contact structures 590. The channel contact structures 590, such as shown by the channel contact structure 590A, can be connected to the channel plug 540 based on the openings 598.

It is noted that when the channel holes 592 are misaligned with the channel structures 530, the insulating layer 525 can isolate the channel contact structure 590, such as the channel contact structure 590B from the top sacrificial layer 522T which will be replaced by top gate layer 523T in a later process.

It is noted that further processing, such as replacement of sacrificial layers 522L, 522M and 522U with gate layer 523L, 523M and 523U, forming ACS and the like can be performed to generate the final semiconductor device 500 shown in FIG. 5.

Figure 9:
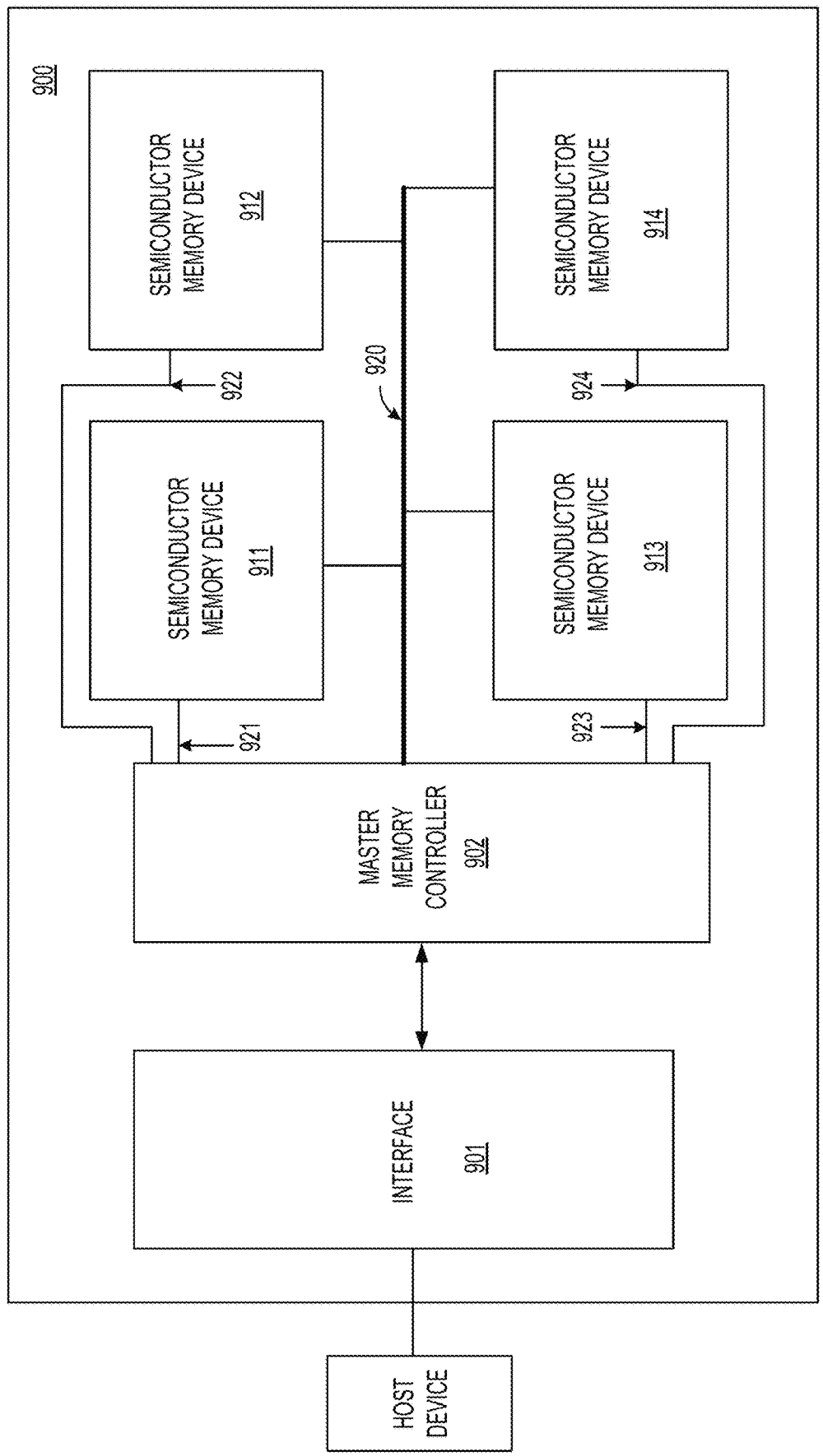
FIG. 9 shows a block diagram of a memory system device according to some examples of the disclosure.

FIG. 9 shows a block diagram of a memory system device 900 according to some examples of the disclosure. The memory system device 900 includes one or more semiconductor memory devices, such as shown by semiconductor memory devices 911-914, that are respectively configured similarly as the semiconductor device 100, the semiconductor device 500. In some examples, the memory system device 900 is a solid state drive (SSD).

The memory system device 900 includes other suitable components. For example, the memory system device 900 includes an interface 901 and a master memory controller 902 coupled together as shown in FIG. 9. The memory system device 900 can include a bus 920 that couples the master memory controller 902 with the semiconductor memory devices 911-914. In addition, the master memory controller 902 is connected with the semiconductor memory devices 911-914 respectively, such as shown by respective control lines 921-924.

The interface 901 is suitably configured mechanically and electrically to connect between the memory system device 900 and a host device, and can be used to transfer data between the memory system device 900 and the host device.

The master memory controller 902 is configured to connect the respective semiconductor memory devices 911-914 to the interface 901 for data transfer. For example, the master memory controller 902 is configured to provide enable/disable signals respectively to the semiconductor memory devices 911-914 to active one or more semiconductor memory devices 911-914 for data transfer.

The master memory controller 902 is responsible for the completion of various instructions within the memory system device 900. For example, the master memory controller 902 can perform bad block management, error checking and correction, garbage collection, and the like.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a memory stack comprising gate layers and insulating layers, the gate layers and the insulating layers being stacked alternatingly;
   a first channel structure formed in a first channel hole in the memory stack, the first channel structure comprising a channel plug in connection with a channel layer of the first channel structure;
   an isolation stack comprising a landing liner layer and an isolation layer, a first portion of the landing liner layer being laid on the channel plug; and
   a first contact structure formed in the isolation stack, the first contact structure being connected to the channel plug via an opening in the first portion of the landing liner layer.

2. The semiconductor device of claim 1, wherein the landing liner layer is laid in a recess of the first channel structure from a top of the first channel hole, and the first portion of the landing liner layer is laid at a bottom of the recess.

3. The semiconductor device of claim 2, wherein the recess is aligned with the channel plug.

4. The semiconductor device of claim 2, wherein the recess is wider than the channel plug.

5. The semiconductor device of claim 1, wherein the first channel structure comprises:
a blocking insulating layer, a charge storage layer, and a tunneling insulating layer between the channel layer of the first channel structure and a top gate layer in the memory stack.

6. The semiconductor device of claim 1, wherein the first channel structure comprises:
an insulating layer between the channel layer of the first channel structure and a top gate layer in the memory stack.

7. The semiconductor device of claim 6, wherein the first channel structure comprises:
a blocking insulating layer, a charge storage layer, and a tunneling insulating layer between the channel layer of the first channel structure and another gate layer in the memory stack.

8. The semiconductor device of claim 1, wherein an etch selectivity of the isolation layer and the landing liner layer is over 10.

9. The semiconductor device of claim 1, wherein the isolation layer is formed of silicon oxide, and the landing liner layer is formed of silicon nitride and/or nitrogen-doped carbon (NDC).

10. The semiconductor device of claim 1, further comprising:
a second portion of the landing liner layer being laid on a top insulating layer above a top gate layer in the memory stack; and
a second contact structure formed in the isolation stack with a bottom landed in the second portion of the landing liner layer, the second contact structure being isolated from the top gate layer by the top insulating layer in the memory stack.

11. A method for fabricating a semiconductor device, further comprising:
forming a memory stack of gate layers and insulating layers, the gate layers and the insulating layers being stacked alternatingly;
forming a first channel structure in a first channel hole in the memory stack, the first channel structure comprising a channel plug in connection with a channel layer of the first channel structure;
forming an isolation stack comprising a landing liner layer and an isolation layer, a first portion of the landing liner layer being laid on the channel plug; and
forming a first contact structure in the isolation stack, the first contact structure being connected to the channel plug via an opening at the first portion of the landing liner layer.

12. The method of claim 11, wherein the forming the isolation stack further comprises:

recessing the channel plug from a top of the first channel hole to form a recess; and
laying the first portion of the landing liner layer at a bottom of the recess.

13. The method of claim 12, further comprising:
removing a sidewall portion of the recess to enlarge the recess.

14. The method of claim 12, wherein the recessing the channel plug further comprises:
recessing the channel plug surrounded by a tunneling insulating layer, a charge storage layer and a blocking insulating layer.

15. The method of claim 12, wherein the recessing the channel plug further comprises:
recessing the channel plug formed in a top select gate (TSG) stack of the memory stack.

16. The method of claim 11, wherein the forming the isolation stack further comprises:
depositing a silicon nitride layer as the landing liner layer.

17. The method of claim 11, wherein the forming the isolation stack further comprises:
depositing a nitrogen-doped carbon (NDC) layer as the landing liner layer.

18. The method of claim 11, wherein forming the first contact structure further comprises:
forming a first contact hole in the isolation layer, the first contact hole landing on the first portion of the landing liner layer;
forming an opening in the first portion of the landing liner layer using the isolation layer with the first contact hole as a mask layer to achieve a self-alignment of the opening to the channel plug, the opening exposing the channel plug; and
forming the first contact structure in the first contact hole with the opening to the channel plug.

19. The method of claim 18, wherein the forming the first contact hole further comprises:
etching the isolation layer with an etch selectivity of the isolation layer to the landing liner layer being over 10.

20. A memory system device, comprising:
a memory controller configured to control data storage operations of a semiconductor memory device; and
the semiconductor memory device comprising:
a memory stack comprising gate layers and insulating layers, the gate layers and the insulating layers being stacked alternatingly;
a first channel structure formed in a first channel hole in the memory stack, the first channel structure comprising a channel plug in connection with a channel layer of the first channel structure;
an isolation stack comprising a landing liner layer and an isolation layer, a first portion of the landing liner layer being laid on the channel plug; and
a first contact structure formed in the isolation stack, the first contact structure being connected to the channel plug via an opening in the first portion of the landing liner layer.

* * * * *